(12) United States Patent
Eberst et al.

(10) Patent No.: US 9,701,019 B2
(45) Date of Patent: Jul. 11, 2017

(54) SYSTEM AND METHOD FOR THE AUTOMATIC GENERATION OF ROBOT PROGRAMS

(75) Inventors: Christof Eberst, Munich (DE); Massimo Ferri, Bassano Romano (IT); Bernhard Stoeffler, Weissenberg (AT); Riccardo Tornese, Lecce (IT); Gerald Umgeher, Pucking (AT)

(73) Assignee: Convergent Information Technologies GmbH, Haid (AT)

( * ) Notice: Subject to any disclaimer, the term of this patent is extended or adjusted under 35 U.S.C. 154(b) by 592 days.

(21) Appl. No.: 14/345,313

(22) PCT Filed: Sep. 6, 2012

(86) PCT No.: PCT/EP2012/067413
§ 371 (c)(1),
(2), (4) Date: Jul. 18, 2014

(87) PCT Pub. No.: WO2013/037693
PCT Pub. Date: Mar. 21, 2013

(65) Prior Publication Data
US 2014/0371905 A1    Dec. 18, 2014

(30) Foreign Application Priority Data
Sep. 15, 2011    (DE) .................. 10 2011 082 771
Sep. 15, 2011    (DE) .................. 10 2011 082 800

(51) Int. Cl.
*G06F 19/00* (2011.01)
*B25J 9/16* (2006.01)
(Continued)

(52) U.S. Cl.
CPC ........... *B25J 9/1664* (2013.01); *B25J 9/1671* (2013.01); *G05B 19/4182* (2013.01);
(Continued)

(58) Field of Classification Search
USPC .............................................. 700/253; 703/6
See application file for complete search history.

(56) References Cited

U.S. PATENT DOCUMENTS 5,598,076 A * 1/1997 Neubauer ................ B25J 9/161
                                                           318/568.13
5,727,132 A    3/1998 Arimatsu et al.
(Continued)

FOREIGN PATENT DOCUMENTS

DE            10162967 A1    7/2002
DE        102004046351 A1    3/2006
(Continued)

OTHER PUBLICATIONS

Hansbo A et al: "Models for the simulation of spray deposition and robot motion optimization in thermal spraying of rotating objects", Surface and Coatings Technology Elsevier Switzerland, vol. 122, No. 2-3, Dec. 15, 1999 (Dec. 15, 1999), pp. 191-201, XP002690759.
(Continued)

*Primary Examiner* — Kidest Bahta
(74) *Attorney, Agent, or Firm* — Laurence A. Greenberg; Werner H. Stemer; Ralph E. Locher

(57) ABSTRACT

Workflow charts for processing (e.g., treating, machining) a workpiece with a tool of an industrial robot are automatically generated. An initial chart has a plurality of tool paths for a workpiece in a defined target position and for defined process parameters. The tool path determines the desired movement of the tool along the workpiece. A state space describing variable parameter values that impact the workpiece processing are defined. Each point in the space represents a concrete combination of possible parameter values. The space is discretized into individual states. The processing of the workpiece is simulated using the initial chart for one or several discrete states and the simulated process (Continued)

results are evaluated according to a pre-definable criterion. The initial chart is iteratively modified, subsequently workpiece processing is simulated using the modified chart for at least one discrete state, and the simulated processing results are evaluated with a pre-definable cost function.

15 Claims, 13 Drawing Sheets

(51) Int. Cl.
G05B 19/418 (2006.01)
G06F 17/50 (2006.01)
(52) U.S. Cl.
CPC ............... *G06F 17/5009* (2013.01); *G05B 2219/39102* (2013.01); *G05B 2219/45065* (2013.01); *Y02P 90/083* (2015.11); *Y02P 90/26* (2015.11)

(56) References Cited

U.S. PATENT DOCUMENTS

| | | | | |
|---|---|---|---|---|
| 6,076,030 | A * | 6/2000 | Rowe | E02F 3/435 172/4.5 |
| 6,157,873 | A * | 12/2000 | DeCamp | B25J 9/1671 700/186 |
| 6,167,328 | A * | 12/2000 | Takaoka | B25J 9/1671 318/568.1 |
| 6,321,137 | B1 * | 11/2001 | De Smet | B25J 9/1692 700/245 |
| 6,646,404 | B2 | 11/2003 | Okuyama et al. | |
| 8,401,698 | B2 | 3/2013 | Kamrani et al. | |
| 2004/0115359 | A1 | 6/2004 | Cebola et al. | |
| 2005/0149231 | A1 * | 7/2005 | Pretlove | B25J 9/1671 700/264 |
| 2006/0025890 | A1 * | 2/2006 | Nagatsuka | B25J 9/1671 700/253 |
| 2006/0212170 | A1 | 9/2006 | Nagatsuka et al. | |
| 2006/0276934 | A1 * | 12/2006 | Nihei | B25J 9/1656 700/245 |
| 2006/0287768 | A1 * | 12/2006 | Bader | G06Q 10/06 700/245 |
| 2007/0073444 | A1 | 3/2007 | Kobayashi et al. | |
| 2007/0106421 | A1 * | 5/2007 | Kamrani | B25J 9/1661 700/245 |
| 2007/0244599 | A1 * | 10/2007 | Tsai | B25J 9/1602 700/245 |
| 2012/0156362 | A1 | 6/2012 | Sadovoy et al. | |
| 2013/0013110 | A1 | 1/2013 | Gordon Petersen et al. | |

FOREIGN PATENT DOCUMENTS

| | | |
|---|---|---|
| DE | 102008027475 A1 | 12/2009 |
| EP | 1700667 A1 | 9/2006 |
| EP | 1769891 A2 | 4/2007 |
| EP | 2345512 A1 | 7/2011 |
| EP | 2468463 A2 | 6/2012 |
| WO | 0249772 A1 | 6/2002 |
| WO | 2005049284 A1 | 6/2005 |
| WO | 2009149805 A1 | 12/2009 |

OTHER PUBLICATIONS

Woenckhaus C et al: "Planning of three-dimensional layouts using numerical optimization methods", Proceedings of the International Conference on Robotics and Automation Atlanta, May 2-6, 1993; [Proceedings of the International Conference on Robotics and Automation], Los Alamitos, IEEE Comp. Soc. Press, US, May 1993 (May 2, 1993), pp. 44-49, XP010094997.

Potkonjak V et al: "Dynamics of anthropomorphic painting robot: Quality analysis and cost reduction", Robotics and Autonomous Systems, Elsevier Science Publishers, Amsterdam, NL, vol. 32, No. 1, Jul. 1, 2000 (Jul. 1, 2000), pp. 17-38, XP004205092.

Cheng et al., "Adaptive Synchronization Control of a Robotic Manipulator Operating in a Intelligent Workcell" IEEE Transactions on Industrial Electronics, vol. 37, No. 2, Apr. 1990, pp. 119-126.

* cited by examiner

SYSTEM AND METHOD FOR THE AUTOMATIC GENERATION OF ROBOT PROGRAMS

BACKGROUND OF THE INVENTION

Field of the Invention

The invention relates to a system and a method for automatically programming and optimizing robotic workflows for an industrial robot having a robot controller.

Industrial robots are customarily programmed using a robot programming language. The result of programming is a program that instructs the robot controller, in particular with respect to the movements of the specific robot. Programming robots is a time-consuming process. Conventional programming methods for robots work "online", i.e., the robot "learns" (by recording) the desired motions ("teach-in") during operation, which assumes that the robot is already built and. To save time and to speed up the start of production, methods have been developed for programming robots "offline". Traditionally, this is accomplished by means of offline programming (OLP) using an included (or alternatively with an external) simulation tool, which runs on an external computer. The output or the result of the programming is a robot program that is validated with the help of simulation. Once simulation and offline programming have been completed, the robot program is transferred to the control computer (the robot controller) of the actual robot.

The offline programming and simulation tool contains descriptions of the robot and the robot controller it is attempting to simulate. However the need exists for more precise robotic simulations, which reproduce not only the movements of the robot, but also the program execution, even simulating system errors that might occur with the actual robot. In the field, efforts are made to avoid adding any costly equipment for the new installation of a robot if at all possible, and to avoid any stops in production. Based upon this need, increasingly accurate models of actual robot controllers have been included in simulation software for robotic simulation, which has led to the use of so-called "virtual robot controllers" during simulation. A virtual robot controller is a sufficiently accurate representation of an actual robot controller, which simulates not only the movement of the robot, but also the execution of the actual robot program. The publications WO 03/059582 and DE 11 2008 003 963 T5 describe methods for programming an industrial robot with the help of a virtual robot controller, by way of example.

Thus, in order to make the industrial robot move its tool center point (TCP) along the desired path, the robot controller requires a suitable robot program. Traditionally, for controlling an industrial robot, all degrees of freedom are indicated explicitly, either by defining all axis values and/or axis positions of the industrial robot or by defining Cartesian TCP coordinate values (position coordinates x, y, z and angle coordinates $\alpha$, $\beta$, $\gamma$), and optionally, the configuration to be used (elbow above/below, etc.) or the additional axis values for intermediate positions, so that the position of the robot can be unambiguously ascertained. The distinct positions are determined, for example, directly on site by means of teach-in (which is frequently undesirable or impossible for the reasons mentioned above) or indirectly by means of the above-mentioned offline programming, which is likewise performed (manually or semiautomatically) on the computer with the help of CAD models of the work pieces to be machined by the robot. Ordinarily, the goal of this is not to define a large number of points, but instead, as in numerous existing applications, for example, to define only the starting point and end point of the individual paths of the TCP. The movement along this path is then planned, interpolated and followed by the control mechanism of the industrial robot. Various known path planning methods for robots are described, for example, in the publications DE 60205928 T2 and Weihua Sheng et al.: "Automated CAD-guided robot path planning for spray painting of compound surfaces", in: Proc. of the IEEE/RSJ International Conference on Intelligent Robots and Systems (IROS 2000), Vol. 3, pp. 1918-1923, and Tapio Heikkilä et al.: "Model Based Interactive Path Planning for Surface Following Robot Tasks", SPIE Proc. Vol. 3208, pp. 551-561, 26 Sep. 1997. Known methods do not adequately support applications involving added complexity in the form of additional degrees of freedom or variations (tolerances), in particular, which must be taken into consideration during programming, for example (A) active movement of the work piece which must be taken into consideration in programming the robot, for example in cases in which the fact that the work piece will be moving on a conveyor while the robot remains securely mounted, for example, (or the work piece will be positioned or moved by another robot or actuator (turn-tilt table, etc.)), must be factored in, or (B) imperfections that impact the result of the machining of the work piece by the robot, and against which preventive measures must be instituted, i.e., a program must be generated which will be robust even in the presence of such defects (the value/extent of which is unknown during programming). This is the case, for example, when imperfections or deviations, for example, variations in the shape or positioning of the work piece or variations in other process parameters, can occur.

Common to all of these cases is that additional degrees of freedom or variants are introduced which can be factored in only with great difficulty, if at all, using known methods of offline programming of robots.

BRIEF SUMMARY OF THE INVENTION

The object of the present invention is therefore to enable the offline generation of "robust" robot programs that will operate reliably and predictably despite variations in the work piece or in process parameters that are unknown at the time of programming, and despite additional degrees of freedom, such as a movement that superposes the work piece.

This object is attained by the method as claimed. Examples of embodiments and further developments of the method are the subject matter of the dependent claims.

Disclosed are a system and a method for the automatic, computer-assisted generation of workflow charts for processing or machining a work piece by means of a tool using an industrial robot. According to one example of the invention, the method comprises the following: preparing an initial chart comprising a plurality of tool paths for a work piece in a defined target position and for defined process parameters that will impact the processing and/or machining, wherein a tool path determines the desired movement of the tool along the work piece; defining a state space, which describes variable parameter values that impact the processing and/or machining, wherein each point in the space represents a specific combination of possible parameter values; discretizing the space into individual states; simulating the processing and/or machining of the work piece using the initial chart for one or more discrete states and evaluating the simulated machining and/or processing result on the basis of a pre definable criterion; and iteratively modifying the initial chart, and then simulating the processing and/or machining of the work piece using the modified chart for at least one discrete state, and evaluating the simulated machining and/or processing result according to a pre definable cost function. Iteration is performed until the cost function reaches a minimum or falls below a threshold value, and therefore until an optimized chart for the respective state is found.

The method can further comprise: assigning the optimized chart and the state used in the iteration to a first group; simulating the processing and/or machining of the work piece using the optimized chart for a further discrete state and evaluating the simulated machining and/or processing result on the basis of the pre definable cost function; assigning the additional state used in the simulation to the first group if the cost function for the additional state drops below a further threshold value; and assigning the additional state used in the simulation to another group if the cost function for the additional state does not drop below the further threshold value. Finally, the iterative modification of the optimized chart and the subsequent simulation of the processing and/or machining of the work piece can be performed for the additional state using the modified chart, wherein the simulated machining and/or processing result is evaluated on the basis of the cost function. Iteration is performed until the cost function has reached a minimum or drops below a threshold value, and therefore until a further optimized chart for the additional state has been found. The optimized chart and the state that is used in the iteration are assigned to a first group.

Before the iterative modification of a chart for a specific state, it can be ascertained by means of simulation whether a machining and/or processing result, for which the cost function falls below a predefined threshold value, will be achieved using a chart for the specific state which has already been optimized.

According to a further example of the invention, the method comprises the following: preparing an initial chart comprising a plurality of tool paths for a work piece in a specific target position and for specific process parameters that describe the processing and/or machining, wherein one tool path defines the desired movement of the tool along the work piece; defining a state space which describes potential sequences and starting times for the tool paths of the initial chart, wherein each point in the space describes a specific sequence having a specific starting time; discretizing the space into individual states; simulating the processing and/or machining of the work piece using the initial chart for different discrete states and evaluating the simulated machining and/or processing result on the basis of a pre definable criterion; and iteratively modifying the initial chart and then simulating the processing and/or machining of the work piece—factoring in a movement that superposes the work piece—using the modified chart for at least one discrete state and evaluating the simulated machining and/or processing result on the basis of a pre definable cost function. Iteration is performed until the cost function reaches a minimum or drops below a threshold, and therefore until an optimized chart for the respective state has been found.

Prior to iterative modification, all states for which the machining and/or processing result simulated with the initial chart does not comply with the pre definable criterion can be discarded.

A motion pattern for the robot base can also be specified, and this motion pattern can be factored in during the simulation.

One example of the invention also relates to a system and a method for controlling a robot for processing or machining a moving work piece by means of a tool using an industrial robot, based upon a chart that comprises a plurality of robot motions defined by path points, wherein each path point is assigned a target position for the work piece; during execution of a robot motion, the method comprises the following: measuring the actual position of the work piece and determining the speed thereof; calculating a current target position for the work piece for the current position of the robot using the target positions for the work piece that are assigned to the path points, for example, by means of interpolation; calculating the difference between target position and actual position of the work piece; and determining the next target position of the robot to be reached, and the time at which this position should be reached, by selecting a path point according to the chart or by interpolating between two path points according to the chart, in such a way that the difference between target position and actual position of the work piece is decreased or minimized.

BRIEF DESCRIPTION OF THE SEVERAL VIEWS OF THE DRAWING

In the following, the invention will be specified in greater detail within the context of examples that are illustrated in the set of drawings. However, the invention is not limited to the illustrated examples. The point is instead to describe the principle upon which the invention is based. The drawings show.

DESCRIPTION OF THE INVENTION

Figure 1:
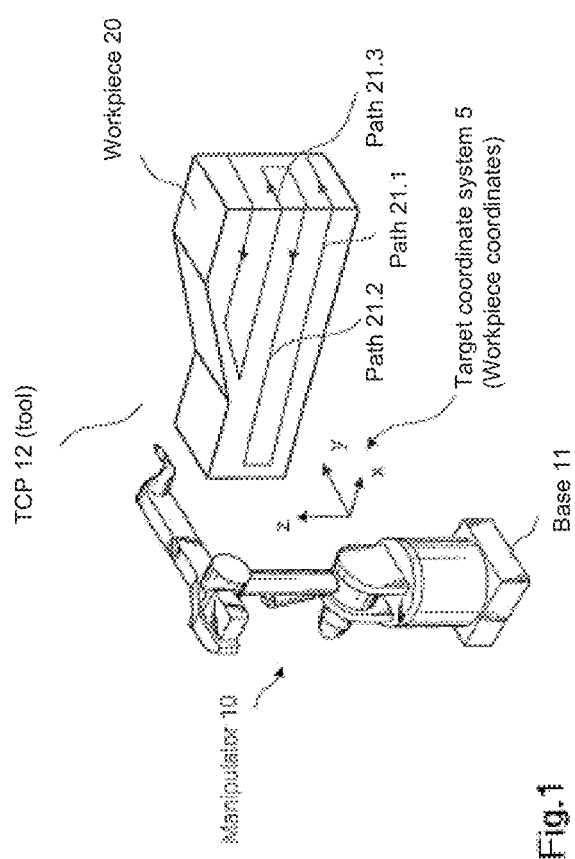
FIG. 1 a diagram of an industrial robot and a work piece that has been machined by the robot, with the tool paths to be run by the robot on/along the surface of the work piece.

As was mentioned in the introductory part, known methods of path planning and offline robot programming do not adequately support applications that involve added complexity in the form of additional degrees of freedom (e.g. a movement that superposes the work piece) or variations (e.g. tolerances for the work piece position and/or for process parameters) which must be factored in during programming.

As examples, reference will be made in the following description to applications in which the surface of a work piece is to be treated with the help of a robot (e.g. coated, cleaned, polished, etc.). The mentioned additional degree of freedom results, e.g., from the fact that the work piece to be treated is moved in a linear fashion during treatment by the robot (for example, with the help of a conveyor belt). The mentioned variations and/or tolerances are, e.g., deviations in the shape and/or the position of the work piece from the target values that are assumed during creation of the robot program, or deviations in other process parameters from the respective target values. Process parameters of this type would include, in the case of robot-assisted coating, e.g., the volume of coating material delivered by a spray gun per unit of time and/or the adhesion thereof to the surface of the work piece (the required spraying angle can be based upon this), and in the case of robot-assisted polishing, e.g. the pressure exerted during polishing by the robot on the surface of the work piece being polished, or the interaction between material and polishing medium. In general, process parameters are understood as all parameters that significantly impact the result of the work performed by the robot (the quality of the varnishing or the cleaning, the polishing, etc., for example).

Before the method for generating robust robot programs is specified in detail, the problems associated with the abovementioned additional degrees of freedom (movement that superposes the work piece) and/or the parameter variations (shape and position of the work piece, other process parameters) will be discussed once again.

During production, work pieces are frequently conveyed continuously or from work cell to work cell by means of automatic conveyor devices (e.g. overhead conveyors, floor-mounted conveyors, etc.). In this connection, it would be desirable if the work piece to be machined did not have to be stopped and/or diverted from the conveyor device in order to execute a programmed application/machining, and could instead be moved forward at a preset speed. However, the programming of non-trivial applications, in which a work piece moves while the robot base itself is fixedly mounted, for example (line tracking), involves added complexity that must be dealt with during programming.

With solutions that are known for very simple applications, the robot controller compensates for the movement of the work piece by shifting its system of target coordinates (the system of coordinates of the work piece from the viewpoint of the robot) with the forward motion information of the conveyor. Since the mere shifting of the system of coordinates does not include a check for collisions, this approach requires that freedom from collisions be guaranteed already during the construction of the cell itself. This can be achieved, for example, by mounting the robot in such a way that, when it executes the application from an open area, for example from above, it is moved up to the moving work piece. This method is not suitable for applications in which the robot is required to establish extended contact between a tool and a work piece, particularly when the tool is to be moved across the surface of the work piece, or when a complex work piece is involved, since it cannot be ensured in advance that the robot (for example, the elbow of the robot) will not collide with the work piece for an extended period of time and over an extended movement of the work piece.

For more complex tasks, the ability to machine moving work pieces involves placing the robot (i.e. the robot base) on an auxiliary axis that will move the robot synchronously with the work piece over broad or over critical ranges of the application. This application therefore corresponds to that of a stationary work piece, with the disadvantage that additional axes, costs, space and maintenance are required. For machining a moving work piece, in many cases an additional axis that is able to move the robot along the direction of movement of the work piece can be necessary. However, better results can frequently be obtained if the robot is not necessarily moved synchronously with the work piece and at the same speed. However, the asynchronous case cannot be accomplished or can be accomplished only with great difficulty using conventional methods of offline robot programming.

In addition to the (known per se) movement of the work piece, frequently, a priori unknown parameter variations must be taken into account. This means that, during production, fluctuations, variations and/or imperfections in relevant parameters (e.g. work piece shape and position, additional process parameters, and in the case of mobile robots, the position and motion of the robot itself), and therefore deviations from the ideal (i.e. from known target values), occur, which, if they are beyond a permissible range, can impair the executability of the application or the quality of the result. However, the automatically generated robot program should be as robust as possible, i.e., the execution of the relevant robot program must provide a process result which corresponds to the quality criteria for the broadest possible spectrum of individual or combined variations/fluctuations/imperfections. The programming of applications that involve such additional complexities is not adequately supported by known methods of offline programming, since unforeseen (deterministic or statistical) fluctuations must be factored in during programming.

As a rule, it is not determined until after programming, i.e., during an operation of the system, through testing or through simulation of the finished program, up to what variations the application will supply the desired results. These tolerance limits must then be complied with, and must be validated, for example, using appropriate sensors. If the values lie beyond the tolerance limits (e.g. if the position of the work piece is not within the predefined "permitted" area), the application will not be started. Since only less robust programs can be programmed by means of conventional methods, and since programming for various imperfections is time consuming, tolerance limits must be kept low at high cost, or the application will have to be aborted more frequently than would be necessary with robust programs.

Simplified Preplanning

Regarding the added complexity which, due to the parameter variations and/or the additional degree of freedom in the programming of the robot, is to be factored in during the programming of the robot, an automatic method for generating robot programs provides for the following. First, the tool paths are planned in the "classic manner" based upon an idealized case, i.e. assuming that all the variations in parameters are zero, and that the shape and position of the work piece correspond to the respective target values. It is further assumed that the work piece is stationary. For this case, a plurality of (automatic and semiautomatic) methods of path planning are available to a person skilled in the art. When this path planning is complete, the result is a "chart", i.e. a definition of the target trajectory of the TCP (and therefore of the tool) within the target coordinate system, which under normal conditions can be easily converted to a robot program. This situation is illustrated by way of example in FIG. 1. Shown are a manipulator 10 having six degrees of freedom on a stationary base 11. The TCP 12 holds the tool (e.g. the spray gun for a coating process). On the schematically illustrated work piece 20, the planned paths 21 are displayed, which are connected to one another in a serpentine pattern—for example. Depending upon the application, it may also be necessary for the paths to always be traveled in the same direction.

The planned paths as a whole represent a chart, which serves as a starting point for the following steps. These data can also be taken from an already existing robot program, in which case the program is converted to tool paths 21 in work piece coordinates. The additional complexity (superposed movement of the work piece, parameter variations) is then factored in automatically, as is described in the following.

Preliminary Analysis of the Chart/Quick Test

Figure 2:
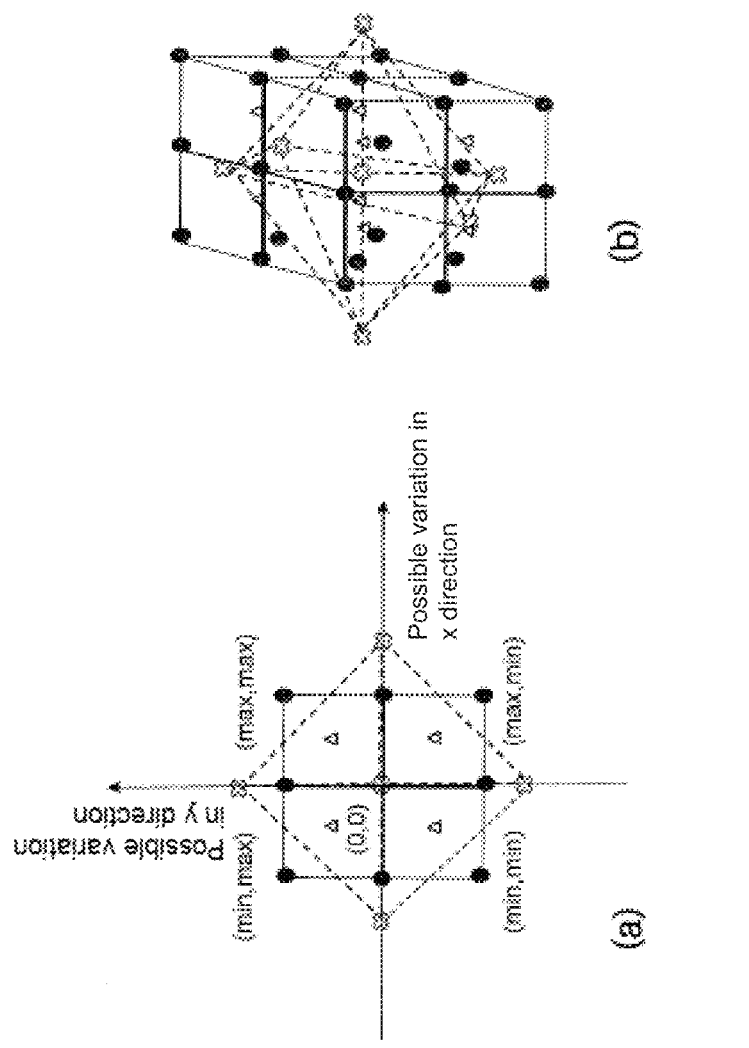
FIG. 2 a schematic illustration of the state space of the n parameter variations for n=2 and n=3.

For cases in which variations in the shape and position of the work piece and other parameter variations are to be taken into consideration, the original chart is simulated for various combinations of parameter variations and/or imperfections, in order to determine whether the chart can be implemented in principle for the relevant case (i.e. the path is feasible without collision) and whether the result of the process of implementing these paths will comply with a predefined criterion for quality (e.g. sufficient application of coating material, adequate pressure during polishing, etc.). For the simulation, a virtual robot with a virtual robot controller (e.g. "realistic robot simulation", RRS or the like) can be used, for example. The mentioned different combinations of parameter variations are chosen such that the entire range of potential parameter variations, particularly, the "worst cases", are covered. In other words, the state space of the parameter variations is discretized. Each discrete point in the state space is represented by an n-tuple with specific parameter variations. In FIG. 2, this is illustrated for the variation of two parameters (n=2, FIG. 2a) or three parameters (n=3, FIG. 2b). FIG. 2a shows as parameter variations, for example, the deviation in the position of the work piece from the target position in the x-direction and in the y-direction. The point of origin in the state space would thus be the ideal position (target position) of the work piece. FIG. 2b shows the same situation for three parameters. In general, the state space of the parameter variations is n-dimensional. If the state space is discretized in such a way that, in addition to the target position, only the combination of minima and maxima is taken into consideration, $3^n$ different states (points in the state space of the parameter variations) are obtained. With an (alternative or additional) consideration of the mean deviations, the number of these discrete states is $2^n$. Alternatively—for a quick consideration—the maximum distances from the origin to the individual axes of the state space can be plotted, which results in $2n+1$ states, including the origin. However, the specific manner in which the state space of the parameter variations is discretized is irrelevant; what is essential is only that the interesting areas of the state pace of the parameter variations are sufficiently "sampled", so that the "sampling" of the state space of interest factors in all possible combinations of variations of the individual parameters. The above-mentioned verification (referred to as a "quick test") of the original chart is performed for each discrete state of parameter variations. For each state, it is determined in the quick test whether or not the original chart can be implemented (feasible and collision-free) and in what regions of the planned paths and/or of the machined work piece the result of the process will comply with a previously defined criterion for quality (e.g. contact pressure during polishing is within a defined range, material application is within a target thickness range, etc.).

Figure 3:
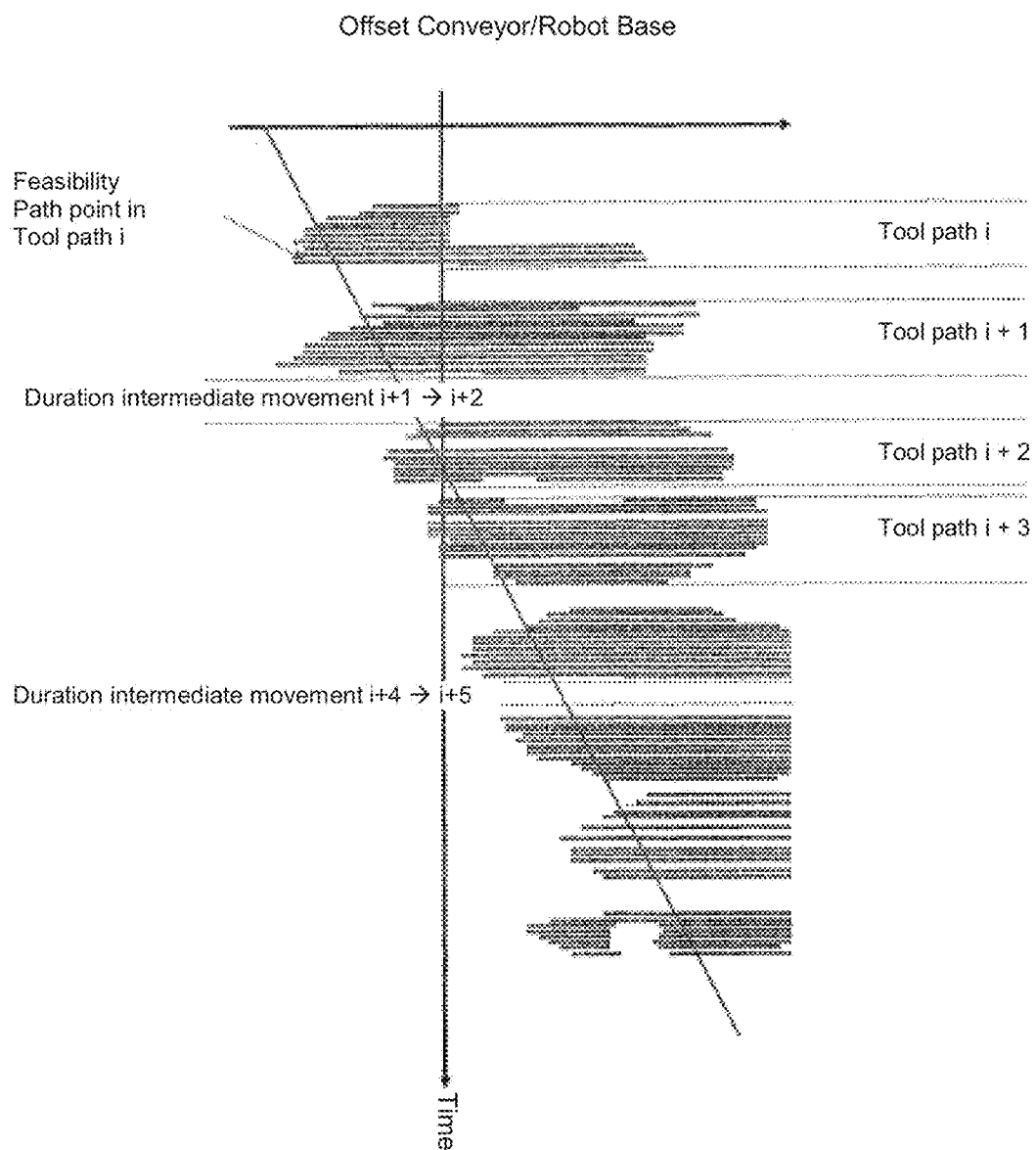
FIG. 3 a diagram showing the offset between robot and work piece, for which individual path points on the tool paths can be reached.

If a movement that superposes the work piece must also be factored in, the original chart will be simulated for various different "states", in order to determine whether the chart can be implemented in principle for the respective case (i.e. the path is feasible, and without collision) and whether the result of the process along the paths will comply with a predefined criterion for quality (e.g. sufficient coating material applied, adequate pressure during polishing, etc.). In this case, a state is not a concrete set (n-tuple) of deviations in parameters, but is instead a concrete sequence of paths and a starting time for machining associated therewith, and optionally a specific, predefined superposing movement of the robot base (assuming such is planned). This situation is illustrated in FIG. 3. The straight line shows the linearly ascending offset between work piece and robot base (at a constant relative speed between work piece and robot base). Furthermore, for each tool path (reference sign 21 in FIG. 1) it is plotted for what offset the individual (sequential) points (vertical lines) of the respective path for the robot can be reached without collision. Assuming a constant relative speed, the slope of the straight lines (corresponds to the speed), the offset of the straight lines (corresponds to the initial offset) and the sequence and associated starting time (and, if allowed by the process, the direction of implementation) of the paths can be adjusted. A "state" corresponds, e.g., to a specific combination of slope, offset and path sequence with associated starting times. A state in which all the vertical lines are intersected by the straight line is satisfactory in that all paths are feasible, in principle. This can be verified for any number of states by means of the quick test. For each state, it can also be determined in which regions a predefined criterion for quality is satisfied, and in which regions it is not. In cases in which a movable robot base is moved gradually, synchronously with the conveyor, the straight line can also approximate the shape of a sawtooth curve. With a free selection of the (linear) movement of the robot base, the relationship between offset and time, rather than a straight line, can be a largely random function of time (limited in terms of slope and curvature based upon speed and acceleration limits). If the robot is fixedly mounted, the slope of the straight line will be determined by the movement of the conveyor, however, this is predefined as a rule, and cannot be altered.

The first two steps of the described example of the method can thus be summarized as follows. First: a chart for a process sequence on the work piece is prepared. This chart comprises the path data for the tool in the target coordinate system (for the work piece) and can be taken, e.g., from a robot program that has been planned in a conventional manner, wherein no parameter variations or additional degrees of freedom of the work piece are factored in during programming. In this step, it is also specified whether and how an additional axis will move the robot base. Second: a state space is defined which represents either (in the case of imperfections/tolerance limits) the parameter variations to be factored in or (if the work piece is moving) the sequence and the associated starting times for the tool paths and the starting time (or the starting offset between robot base and work piece). Following discretization, the individual states are subjected to a quick test, in which it is verified whether— for the respective state—the chart predefined in the first step can be executed in principle (i.e. all paths can be reached) and whether or not (and at what points along the work piece) the result of the process will comply with predefined criteria for quality.

States for which a specific number or a specific portion (expressed as a percentage) of paths are not feasible and/or executable (or are only insufficiently feasible and/or executable), or for which the result of the process will not comply with the criterion for quality over a sufficiently large area of the work piece (predefined threshold value), will be discarded as a result of this evaluation and will not be further processed in the next step. If no "usable states", or (in cases in which parameter variations are to be factored in) if insufficient numbers (more than a minimum number) of usable states remain, it can be concluded that the chart prepared in the first step is essentially unsuitable. The remaining states define the area in the state space for which the chart prepared in the first step is suitable, in principle, and can be converted to a practicable chart through modifications. Depending on the embodiment of the method—if it is necessary to discard states at this point—the process can also be aborted in order to prepare an alternative initial chart in the first step. Following the quick test—depending upon the embodiment of the method—the (remaining, not discarded) states can be grouped. Grouping is performed by classifying states in which similar deficits occur in the same areas of the work piece in the same group. The same deficits in the same areas of the work piece means, e.g., in the case of polishing the work piece surface, states for which, e.g., the contact pressure during polishing is always insufficient in the "left front" area of the work piece. Similarly to the example involving the application of coating material: it can occur in this case, e.g., that in certain edge regions for certain states, the application of coating material is too thick or too thin, because, e.g., the TCP is not able to run the path, is no longer able to run the path at the correct angle, or is no longer able to run the path at the correct speed relative to the surface. Therefore, these states would also be classified into one group.

Thus the above-described quick test analyzes discrete states. The criterion (the "yardstick") by which it is determined whether the chart for a specific state will be discarded as unusable can differ widely, depending upon the application/objective. In cases in which parameter variations are to be factored in, even relatively "poor" results may be accepted (with a strong optimization requirement in the subsequent step) before the chart for a state is actually discarded, whereas in cases in which the movement of the work piece is to be factored in, the yardstick can be held significantly higher (even if only one state is left in the end). The difference therefore results because (1.) in cases in which parameter variations to be factored in, a chart will never be "OK" for all states without modification, as a rule, (2.) in the subsequent step, multiple charts (e.g. one for each specific group) can also be generated, and (3.) in the subsequent step (the step following detailed planning/optimization/validation) the aim is generally to generate usable charts for as many states as possible (preferably for all). The "abort" option is used more because—when a satisfactory result can be obtained for too few states—it is frequently more expedient to start over again at the beginning, and to modify the initial chart. In cases in which the movement of the work piece is to be factored in, one usable state (i.e., a usable sequence of paths having starting times, etc.) is theoretically enough for generating a chart. Several states increase the probability and/or under certain circumstances can provide a better result following a comparison.

Optimization and Validation

In the third step, which has not been described above, the chart, which has been tested using the quick test and has been analyzed for various states, is used as the "initial solution" for a further optimization step.

With the grouping carried out in the preceding quick test, it is frequently possible to improve the result through optimization (i.e., using an optimized chart). The goal of this can be to identify an optimized chart which functions satisfactorily, despite the existence of imperfections and/or of parameter variations, and/or despite the movement of the work piece. In cases in which potential parameter variations must be factored in, the goal can also be to find several different optimized charts for different sub regions of potential parameter variations/imperfections. For example, one chart can be generated for each group defined in the preceding quick test. During the later actual implementation of the chart, the work piece is measured using sensors (e.g. cameras, laser scanners, light section sensors, etc.) and the "position" of the deviations in the state space of the parameter variations is identified. Depending upon the subregion in which the imperfections and/or parameter variations actually occur, the chart that is optimized for the relevant region (and/or the robot program that is based thereon) is used.

In the above-mentioned optimization step, the entire process (i.e., the coating or polishing process performed by the robot, for example) in the "initial solution" identified in the quick test is fully simulated with the help of a virtual robot controller and the result is analyzed, for example, with the help of a cost function. Different variables (optionally differently weighted) are used in this cost function, e.g., the portion (as a percentage) of the paths that cannot be run, the proportion of the work piece surface in which the above-mentioned quality criterion is exceeded or undercut, the exceeding of acceleration limits, etc. The goal of this optimization is to minimize this cost function. In order to achieve this minimization, the initial chart can be adapted in various ways. For example, the sequence and the associated starting time of the paths and the starting time (and/or the initial offset between robot base and work piece) of the implementation of the chart can be modified, the speed of the tool along the paths can be adjusted, the position of the paths on the work piece surface can be adjusted (within predefined limits), the distance between work piece and tool (e.g. spray gun) and the angular position of the tool relative to the surface can be adjusted. By iteratively adapting and then simulating the chart, the cost function can thus be minimized, and a chart that is optimal in this sense can be identified. The mentioned options for modifying the chart are understood as an example and not as an exhaustive listing. Moreover, not all listed options are obligatory. An attempt may also be made, e.g., to generate a valid modified/optimized chart merely by varying the starting times and the running speed of the paths, without again modifying the sequence of the paths (which has been determined during the quick test).

Conversion to a Robot Program

In a fourth step, once sufficiently satisfactory charts have been identified, these charts (all or some thereof) are converted to one or more executable robot programs (movements, switching points, signals, waits, etc.) and is stored together with the information regarding the additional complexity to be factored in (e.g., desired forward progression of the conveyor for the start and end of each path or for each path point within a path, or the area of the imperfection/ parameter variation for which the respective chart as a whole is valid and can be implemented).

EXAMPLES

The above-described method for the computer-assisted automatic (computer-assisted) generation of optimized workflows (charts) for robots and/or of corresponding robot programs offers the advantage during the development phase that the planning engineer, or the automatic OLP or planning tool that is used, needs to factor in only the simplified case, and the additional complexity (which results from a movement that superposes the work piece or from the consideration of parameter variations) is factored in automatically, proceeding from the chart that is developed for the simplified case. In the following, the process, which up to this point has been described only in general terms, will be specified in greater detail within the context of a—generalizable—example.

Example 1

The first example addresses the case in which a (predefined) movement superposes the work piece. In general, the work piece can move in N degrees of freedom in the predefined manner. At the same time, the robot base can move over time (in a likewise predefined manner). In the following example, the work piece is moved by means of a linear conveyor (e.g. conveyor belt, N=1).

In a first step, the tool paths for the desired work task of the robot are planned or specified in a known manner (in work piece coordinates in the target coordinate system) as if the work piece (and the robot base) were at stationary. Alternatively, conventionally generated robot programs can be read in and converted to tool paths in the work piece coordinate system. "Conventionally generated" is understood to mean, among other things, that the programming is based upon the above-mentioned assumption of a stationary work piece. The movement of the linear conveyor in most cases is firmly predefined by the production sequence, and in most cases cannot be influenced. In any case, the movement of the conveyor is defined in this step (optionally according to the predefined parameters). At the same time, the "strategy" for handling this additional complexity, which results from the movement of the work piece, is established. In practice, there are essentially three options for this: first, the robot is mounted on a fixedly positioned robot base, second, the robot is mounted on (at least) one auxiliary axis with a fixedly predefined motion pattern, or, third, the robot is mounted on one or more auxiliary axes having a freely plan able motion pattern (optionally, a preferred behavior can also be established, such as minimal accelerations, a minimal path or minimal energy or movement synchronously with the conveyor movement, for example). In the third case, this movement can first be predefined, and can also be modified in the subsequent optimization step. If the movement of the work piece is predefined and the movement of the robot base is defined, the relative movement between robot base and work piece and therefore the (time-dependent) offset between robot base and work piece is also defined.

After this (second step, quick test), the impact of the additional complexity to be factored in (i.e., the movement superposed by the work piece) on the application (i.e., on the execution of the proposed chart) is determined in a quick analysis, as described above. The state space is discretized, wherein in the present example, each of the discrete states represents a specific sequence of tool paths and a specific starting time (start offset). In this, each individual tool path (see FIG. 1, reference sign 21) is subdivided by so-called path points on the tool path, which subdivides the respective path into path segments. This subdivision is fixedly predefined, but can still be modified if necessary in the subsequent optimization step. A path is therefore defined by the totality of its path points. For each tool path of the previously proposed chart (see FIG. 1, reference sign 21), testing and/or simulation is performed to determine for which discrete (starting) offset values individual path points (or segments) on the respective tool path can be achieved. For purposes of illustration, the result can be recorded in the diagram shown by way of example in FIG. 3 as a solid or dashed vertical line on the (offset) Y-axis. On the basis of the target speed of the tool and the length (in a 6-dimensional configuration space) of the paths between two adjacent path points (segments of the respective tool path), it is determined/estimated how far apart these vertical lines (which represent permissible displacements) lie in terms of time (in the horizontal direction in the diagram of FIG. 3). Between the last and first path points of sequential tool paths (see FIG. 1, reference sign 21), the estimated or simulated time required for the movement of the robot between the paths is factored in as a distance over time on the (X-) time axis. This distance over time represents the time required by the robot, once the running of a tool path has been completed, to begin running the next tool path. For example, a reconfiguration of the elbow configuration of the robot (from "elbow up" to "elbow down") between the running of two tool paths may be necessary. If necessary, the robot can also wait between two paths until the time for starting running of the next path. The target speed (and/or the motion pattern) of the conveyor likewise results in a curve over time in the diagram of FIG. 3. As was already discussed above, with a relative movement at constant speed, this curve is a straight line which extends diagonally over the offset axis and the time axis (see FIG. 3).

On the basis of the simulated values (i.e. on the basis of the simulated distances over time between the path points and the individual tool paths), one or more favorable (i.e., assessed as suitable on the basis of an established quality criterion) sequences of tool paths and associated starting times are defined as follows: by varying the sequence and starting times of the tool paths (=tool paths) and optionally the execution direction thereof, arrangements (states) are sought in which the motion curve of the work piece (diagonally extending straight line in FIG. 3) intersects the vertical lines of the individual path points (representing the permissible offset) of all paths. The maximum and minimum offset, in which the motion curve of the work piece still intersects the vertical lines (theoretically possible offset values for the respective path point) of all path points of a path, also defines a time slot (or transformation window) for the respective path. Within this window, the respective tool path can be run by the robot (according to the quick test).

In establishing the sequences and starting times for the individual tool paths, for example, the distance of the individual intersection points on the motion curve of the conveyor from the end points of the permissible offset, plotted in the Y-direction, (or from the edges of the time slot) of a tool path can be maximized. Alternatively, the distance from the latest possible ending time can also be maximized. In the second case, tool paths can also be run with lag time, with which the solution remains executable if the robot needs more time for the (subsequent) full dynamic simulation (detailed planning/optimization/validation) and the actual execution. The distances (over time) between the individual tool paths can also optionally be maximized (buffer times). If no executable sequence can be found or if the remaining time buffer (distance over time between time of execution of the path and time slot) for the identified sequence are smaller than a minimum threshold, then in the subsequent detailed planning/optimization it is highly probable that no valid chart will be identified, or only charts that are not robust with already low imperfections relating to time (e.g. variations in the speed of the conveyor). In such cases, the process will be aborted, and a message will be sent back to the developer (or to the automatic OLP tool) that the strategy (e.g. selecting a robot having a fixed base or the defined motion pattern of the robot base) and/or the tool paths that were defined in advance without factoring in the additional complexity cannot be implemented. Afterward, a new and/or modified initial chart must be proposed, and/or the movement of the robot base must be adjusted, whereupon the automated process is restarted. In one advantageous embodiment, the best possible sequences, including those paths that have been analyzed as critical/not plan able, are indicated for supporting the manual re-planning/modification.

The tool paths initially planned in the first step (the "initial chart") and the suitable states thereof (sequence and starting times) identified in the second step (quick test) are refined, optimized and evaluated in the subsequent optimization step (one after the other, in a loop), which will now be described. In this step, the precise robot movements for each individual path and the intermediate movements between these are simulated using the dynamic robot model (factors in limited acceleration, speed) in the work cell, which changes over time as a result of the simultaneous movement of the tool, with the help of a virtual robot with a virtual robot controller. During optimization, the starting times and the running speed of a movement that corresponds to the tool paths (including the times between the running of the individual paths), and to a small (definable) extent, the paths to be run are themselves modified (according to known algorithms) with the goal of maximizing the (estimated) values, obtained during simulation, for the following criteria: the length (as a percentage) of the runnable tool paths and/or the percentage of the surface of the work piece in which the process simulation for the (precisely simulated) run tool paths produces positive process results (neither too much/too little material removed, nor exceeded parameters, such as contact pressure, for example . . . ). In this case, during process simulation, the respective result for an optimized chart (e.g., cleaning effect in the case of cleaning: cleaned, not cleaned, uncertain, etc.) is stored together with the description of the surface (e.g. CAD data) of the work piece. In one embodiment example of the method, the positions of the tool (and therefore of the robot in relation to the surface) are adjusted using the planning or optimization algorithms such that the percentage of the relevant work piece surface in which the quality criteria are complied with is maximized. "Gaps" or "defects" (e.g., during coating, polishing, etc.) are weighted more heavily, so that these will preferably be closed and contiguous regions achieved. Discarded movements (e.g. paths and/or individual path segments) can be evaluated using a negative value (which affects the measure that analyzes the process result) or merely using the negative impact thereof on the process result. As a further optimization criterion, it can be specified that the loop time (i.e. the entire working time required by the robot for the process) is to be maintained, held below a maximum time, or further minimized. Very generally, it is maintained that any minimization of a cost function is identical to a maximization of a utility function that is complementary to the cost function. If the cost function is minimized, the complementary utility function is automatically maximized.

From the tool paths, the target position and target speed for each robot axis for a target point in time are calculated using the inverse kinematics for all planned path points. The motion planning is based, for example, on probabilistic methods (e.g. "Rapidly Exploring Random Trees", RRT, or "Probabilistic Road Maps", PPM, etc.) which seek connections between starting and ending positions in the state space (e.g. joint angle and the speeds thereof, and the time), wherein a path point is a starting point and/or ending point for connected path segments. In the method described here for processing moving work pieces, however, the runtime performance and the limitations of speed and acceleration of the axes must be factored in. Moreover, the state space within which the (above) known methods seek is limited in that it is taken into consideration that for each state, only a limited additional adjustment of position and speed is possible. To this end, for each path point i, the state (position and speed) of each axis is projected up to the time of the next path point i+1 for the limiting cases of maximum negative and/or positive acceleration away from path point i. In addition, from the state at the current path point i, the two extreme cases of movement (maximum acceleration) up to the state at path point i−1 are stipulated. Permissible states for each axis can lie only between the two extreme paths—i.e. in the area that extends between minimum and maximum. Only when an area of overlap (for all axes) exists across the entire segment between two path points, these areas from path point i forward and path point i+1 backward, is there a change in the state that respects the actual limitations of the axes in terms of acceleration and speed. Since the subsequent path planning in the state space (according to known methods) can seek connections only of states in this overlap area, this planning is preceded by an optimization according to known methods which a) maximizes the overlap area, and b) attaches a negative value (invalid) to "constrictions" of the state space. For this purpose, as part of planning, the states are modified in terms of axis position and axis speed and time when these are reached, wherein every change is assigned costs (costs can vary according to the process, and therefore, e.g., in the case of contact-based cleaning, the position of the tool is more decisive than the speed, and in the case of coating, frequently, maintaining the tool speed over the surface is more critical).

In this state space, which has been limited in this manner, the precise collision-free motion is planned and simulated according to known (e.g. PRM, RRT) methods. With sufficient computation time, in one embodiment example of the method described here, the process for the motion of the robot precisely predicted in this manner is simulated. The result is stored as described in reference to the surface, and the percentage of the areas that are machined as desired (quality criterion is within the target range) is used as the criterion to be maximized.

Optimization is ended as soon as the result for a sequence is satisfactory, the convergence has been slowed, or a number of iterations has been exceeded. Depending upon the implementation, all "states" identified in the preceding quick test (sequences with starting times for the paths) can be tested, or when the first satisfactory result is obtained, the loop can be interrupted.

If no usable solution has been found for any of the states that were preplanned in the quick test (sequences with starting times), the process will return to the first step, and a new initial chart must be proposed. According to one embodiment example of the method described here, the reason for discarding a chart, i.e., (parts of the) tool paths that cannot be run or areas on the work piece in which the process produces unsatisfactory results, is reported (along with the tool paths which contribute to this).

In the step that follows detailed planning/optimization/validation, robot programs (which can be run on the actual robot controller) are generated and are provided with additional information regarding the added complexity "movement of the work piece". For this purpose, the planned movement of the robot is discretized (e.g. in equal time intervals or equal path lengths) and stored as path points ("point-to-point", PTP, splines, etc.) including speed, along with an indication of the target position of the conveyor (or the target time or the work piece position, measurable via the path encoder value of the conveyor) for which these path points are to be reached. In a static environment (work piece is stationary) it would be sufficient to define the path, i.e. to define which path points (optionally at what speed) are to be followed. For the case described here, it is also defined when the respective path point must be reached. For example, in the case of a conveyor having completely deterministic properties, the time at which a path point will be reached could be defined. In the case of a conveyor with variations, for example, the position of the conveyor in which a path point is to be reached is defined.

Advantageously, the program is output in two parts: a) as a list of positions and speeds (of the robot axes or of the TCP) with the associated target positions of (work piece or) conveyor, wherein these latter can be more closely discretized than is required by a robot controller for execution, and b) a processing program in the form of a loop, which reads the current actual value (position and speed) of the conveyor and, based upon this, selects or interpolates the next target position of the robot from the list from (a) and increases, decreases or maintains the speed on the basis of the current speed of the conveyor and the progress of the robot motion in relation to the conveyor movement (rushing ahead, lagging behind) according to known control principles (in the simplest case, a PID controller). With the help of this implementation, (1.) imprecisions in the planning of the robot motion (particularly errors in the model of robot dynamics and control) are compensated for and (2.) the speed of the robot is adapted to potentially fluctuating or alternating conveyor speeds (even to the point of a full stop or a reversal of the conveyor). The programs that are linked to the movement of the (conveyor or) work piece are loaded onto the robot controller or are intermediately stored, and are available for online execution.

The aspect of the invention described above can therefore be generally summarized as a method for controlling a robot for processing or machining a moving work piece by means of a tool. In this process, the robot executes a movement according to a chart, which is defined by a plurality of through path points. As mentioned, each path point is assigned a target position of the work piece. During execution of a robot movement, the actual position of the work piece is measured, and the speed thereof is determined. The current target position of the work piece is calculated on the basis of the current position of the robot, using the target positions of the work piece that are assigned to the path points. This can also be achieved by means of interpolation, for example. The difference between target position and actual position of the work piece is calculated. On the basis of this, the next target position (path point) to be reached by the robot and the associated time at which this position is to be reached are determined (which can be accomplished by defining the path speed of the tool, whereby the time of arrival at the path point is determined). For this purpose, a path point is selected according to the chart, or a point is calculated by interpolation between two path points of the chart, such that the current difference between target position and actual position of the work piece at the next path point will be decreased or minimized.

For the actual online execution of the program (not coupled to time), sensors acquire the information about the movement of the work piece (position and speed) by the conveyor. Based upon whether, during execution of the program, the measured conveyor movement is rushing ahead or lagging behind the planned movement, the speed values (per position/work piece) of the program can be increased or decreased. In the described advantageous implementation of the division of the program into two parts with close discretization of the paths, the next position values can also be recalculated/interpolated on the basis of the instantaneous speed of the conveyor and whether it is rushing ahead or lagging behind, up to the calculation of position values that do not change over time when the conveyor is stationary, or the calculation of positions that are from a previous time (when the conveyor is moving backward).

Example 2

In the second example, it must be taken into consideration that during automation, deviations in the position or movement of work piece or robot, or deviations/imperfections/variations in the parameters of the process (deviating quantities or adhesion of coating material, efficacy of grinding media, cleaning efficacy, quantity or adhesion of dust) can occur (hereinafter referred to as parameter variations). The actual values of the parameter variations can in part be measured before or during execution, but are not known at the time of planning (only the range of variation). The problems relating to this and the basic procedure for factoring in parameter variations in order to generate robust charts for robots have already been discussed further above.

In a first step (as in Example 1), the tool paths (in work piece coordinates) are planned or specified without factoring in the parameter variations (i.e. for an idealized case), or are read in from existing programs and converted. In addition, the parameter variations to be factored in are defined (e.g., distribution per dimension, maximum variation range, confidence interval for each variable parameter etc.). Optionally, dependencies and correlations between the variable parameters can also be factored in. In this step, the strategy for factoring in parameter variations during automatic planning is also determined. The latter is, e.g., that (1.) precisely one program will be generated (as in example 1), which covers all variations (e.g. when no sensors can be/will be used for measurement thereof) or (2.) precisely one program will be generated, which covers the largest possible range of parameter variations or (3.) several optimized programs (upper limit defined) will be generated, which together cover the entire range of parameter variations, which are then measured for the time of execution. According to one embodiment example, an indication is provided as to which individual factors cannot be measured, i.e., cannot be subdivided into different "groups". The grouping of different states in the space of parameter variations has also already been addressed further above.

In a second step (quick test), in the same manner as the preceding Example 1, the impact on the application of the added complexity to be factored in (previously the movement of the work piece, now the parameter variations) is determined by means of a quick analysis. In this, for N parameters/dimensions to be analyzed (N is the number of individual, defined varying parameters), the range of variation thereof is input and is defined by combining an N-dimensional state space, which is then discretized ("sampled") in such a way that a discrete quantity of combined imperfections/variations (=states) is present. Examples of the discretization of the state space of the parameter variations have already been discussed in reference to FIG. 2. States that cannot occur on the basis of correlation or the mutual exclusion of individual imperfections can be eliminated according to one embodiment example.

For each discrete state, the tool paths (i.e., the original chart) originally defined (in the first step) are then tested. This means that the process and the robot motion are simulated, and the respective state is analyzed on the basis of the percentage of (non-) executable motions and on the basis of the percentage of the surface of the work piece for which the process result has been simulated as satisfactory, poor, colliding (or metric, etc.).

All states for which the above simulation of the initial chart provides a satisfactory result (the benchmark for this is reaching a predefined quality criterion, as was already discussed further above) are combined as a group, and stored together with this chart. The remaining states are likewise grouped, wherein states in which (exclusively/predominantly) similar problems with the robot motion occur in the same segments of the tool paths and/or (similar) problems in process quality (stored and evaluated as a process result over the individual regions on the surface of the work piece) occur at the same location on the work piece, are likewise each combined in one group. In applications in which a work piece is to be coated by the robot, e.g., those states of parameter variations in which the amount of coating material applied to the same area of the work piece surface (simulated in the process simulation) is insufficient, for example. According to the embodiment example described here, the procedure for analyzing the suitability of the initial chart with regard to the strategy selected for factoring in the parameter variations is as follows.

Variant 1: The individual results of simulations of the initial chart for the individual states (combination of parameter variations) are superimposed in such a way that the locally (meaning the position on the work piece surface or on the tool path) poorer result will overwrite the better result in each case. The worst case is formed, so to speak, over the simulations of the initial chart for all states. This applies both to regions of the work piece in which a simulated process result (for a state) that is evaluated as poorer overwrites all better results, and for tool paths in which segments that cannot be run for a state "dominate" when the same segment can be run in another simulation.

Variant 2: The percentage of states for which the simulation predicts no satisfactory result is analyzed (the severity of the individual problems can be weighted).

As a criterion for aborting the process and returning to step 1 (preparing the initial chart in the simplified case), in "Variant 2" the percentage of simulated states that provide an unsatisfactory result can be used, and in "Variant 1" the percentage of the work piece surface that is assessed as unusable (once all simulation results have been overlaid) and/or the percentage of tool paths that cannot be run can be used. If this criterion drops below a bottom threshold, it is assumed that the subsequent detailed planning/optimization will not succeed in factoring in all states (possibly with small restrictions) using only a single or a limited number of charts (later converted to robot programs). If the percentage is higher than a selectable threshold, the initial chart will be discarded, and a new initial chart must be proposed (as in Example 1 above). The threshold value is dependent upon the strategy that is selected and is higher for the strategy of "one chart for all states" than for the strategy of "P charts for all states". Alternatively, with the "P charts" strategy, it can also be tested to determine whether the identified number of groups is less than or equal to the number P of desired charts. In the next step (step 3, detailed planning/optimization/validation), the tool paths of the initial chart are optimized simulated in greater detail for the identified groups. According to one embodiment example, a decision is also made as to whether the strategy is: "one chart for all states" or "P charts for all states".

For the strategy of "one chart for all states", the initial chart is modified and optimized on the basis of known methods. A chart for which a predefined cost function is minimized is, in turn, considered optimal. The following can be included in this cost function: the percentage of the work piece to be machined for which the simulated process result (stored with the associated work piece surface coordinates) lies beyond permissible tolerances (optionally weighted with the degree of deviation), the time required for execution, etc. According to one example of the method described here, the version of the chart currently being optimized is always simulated the same for all or for several different (random and increasing in number) states (of the imperfection/parameter variation), and the results are overlaid in such a way that (locally) unusable process results (e.g. application of coating material is insufficient within a specific surface area) will overwrite usable process results for other states, in order to identify the worst case. With this strategy, all discrete states of the space of the parameter variations are classified for practical purposes within a single group.

For the strategy of "P charts for all states", the groups of states formed during the quick test are processed one after the other, and a single chart is optimized for each group. This can be carried out for all tested states in a group in the same manner as for the strategy of "one chart for all states" (see above).

Alternatively, for each state of the current group, it can be simulated to determine whether a previously optimized chart (for a state in the same group or for a chart optimized for another group) will provide an adequate simulation result (within pre definable tolerance limits). For this purpose, the process is simulated over all paths of the tool that can be run according to robot simulation, and is overlaid and stored in reference to the work piece (e.g., in the case of applying coating material, the layer thickness on the surface description (e.g., mesh, CAD data, etc.)), wherein any critical situations that arise (collisions, excessive contact forces, etc.) will overwrite positive results (in this manner, the worst case is identified, as described above). The result of process simulation is, e.g., the resulting layer thickness or the cleaning effect on the description of the work piece surface. In the case of applying coating material, these are, e.g., values in micrometers or notations such as "OK", "too thick", "too thin" etc. In the case of cleaning, these are notations, e.g., such as "cleaned", "not cleaned", "uncertain", etc. If the percentage of the relevant work piece surface in which the quality criteria are satisfied in relation to the overall surface is above a required limit (wherein different regions (e.g. design edges) or the nature and severity of the exceedance can be weighted differently in the analysis), or if the percentage of discarded paths is small enough, then the state currently being tested will be assigned to the tested chart without modifying the chart. Depending upon the implementation, the first suitable chart can be used, or the chart that receives the best evaluation of all the charts can be used. According to one embodiment example, for each group, the initial chart is optimized for only one state in the group, and a test is then performed to determine whether this chart is also suitable for all the other states in the group. Those states for which the chart is unsuitable are placed in a new group. Alternatively, before optimizing a chart for a state in a group, it can be examined whether a chart that has already been optimized for another group is suitable. If so, the respective groups can be combined. In the end, a modified chart is left for each group of states.

If the simulation result is not sufficient for any of the charts that have already been developed, then a new group will be initiated for the state currently being tested, and the optimization process (similarly to the strategy of "one chart for all") for that state will be initiated, wherein in one advantageous implementation, the chart (generated up to that point) that has received the best evaluation thus far (even if it is insufficient) will be used as the starting point for the optimization/adaptation, or alternatively, the initial chart from the first step will be used. The detailed planning and/or optimization algorithms according to the prior art (e.g. "Particle Swarm Optimization") will vary the tool paths in relation to the work piece (in particular, in relation to the work piece surface, in such a way that the percentage of relevant work piece surface) in which the quality criteria are satisfied is maximized. The path segments of a tool path will thus be shifted, tilted, raised slightly, etc. in relation to the work piece surface in order to improve the process result. Preferably, "gaps" or "defects" are more heavily weighted, so that they will preferably be closed and/or eliminated, and contiguous regions will be achieved which satisfy the quality criteria. In addition (with a motion chart as in Example 1) or according to the prior art), for each tool path (and the connection thereof), an executable robot motion is sought/planned. Tool paths that cannot be run at all or that cannot be run in part can also be analyzed using a negative value, or simply provide no contribution to the result of simulation. The duration of the motion (i.e., the time required by the robot to execute the machining) can be a further criterion for optimization. The state and the optimized chart are stored as a new group. States that are examined later and can be covered by the same chart are assigned to the group.

In an alternative embodiment, all states for which no suitable chart has been identified on the basis of the grouping from the quick test, and for which, as a result, a new group has been defined, or states that have been newly assigned to another group (other than that of the quick test) earmarked for exceptional handling, in which, once all states have been processed, further testing will be performed to determine whether these newly formed groups can be combined further.

The loop is continued until a chart exists for each group, i.e., the entire defined state space of the parameter variations is covered, or is terminated if no chart can be found for a state, or if the number of groups exceeds the permissible number of charts. Depending upon the specifications, the loop can be terminated as soon as no solution has been found for a state (back to the identification of a new, improved initial chart) or when only those states for which no solution has been found are intermediately stored, after which a new initial chart will be prepared only for those states, while the identified solutions are retained.

Ideally (assuming adequate time for simulation), in a subsequent optimization, the charts can once again be optimized over all variations that are contained in the group/cluster, in the same manner as was described for strategy 1 ("one chart for all").

The chart or charts is or are stored together with the additional information (states covered here=region of the imperfection/parameter variation for which the respective chart is valid).

In the next step, the chart or charts is/are each converted to a robot program (executable in the controller=robot specific) (list of joint states, splines, signals, etc.) by "sampling" (discretizing) the planned robot motion, and is/are stored together with the additional information about the dimension that is automatically factored in (in this case, the region of the permissible parameter variation for which the chart of the respective group is valid).

For the (not coupled to time) online execution of the programs, sensors acquire the information relating to the actual parameter variations (or at least a part thereof), in the present case, the actual values of the individual (measurable) imperfections (e.g. position deviation in X, Y, Z, etc.). The group which contains these specific imperfections/parameter variations is then selected, and the program that is assigned to this group is uploaded into the controller. Optionally, the stored chart for the measured state can be optimized as described in the above optimization step.

In the following, the process described above will be summarized again and specified in greater detail in reference to FIGS. 4 to 13. According to the method underlying the invention (FIG. 4), first an idealized application is planned (or programmed). Idealized in this context means e.g. (quasi-) static and/or without imperfections. Alternatively, existing programs can also be read in and converted (step I). Only then is the additional complexity/dimension, conditioned by dynamics (work piece movement) or imperfections, automatically factored in, and the charts and programs that can be used for these more complex cases generated.

This is accomplished as follows: In a pre-processing step, the impact of the additional complexity/dimension (movement that superposes the work piece, parameter variations) on the original chart and/or the original program is simulated, and the process result (quality of the coating, polishing, etc.) is analyzed and a quick test (step II) for "rough planning" seeks "initial solutions" or cases (referred to further above as states in the state space of parameter variations and/or in the state space of the potential motion pattern). These are processed in a loop, and identified solutions are optimized and validated, and optionally combined (step III). From identified charts, one or more programs are combined.

Figure 4:
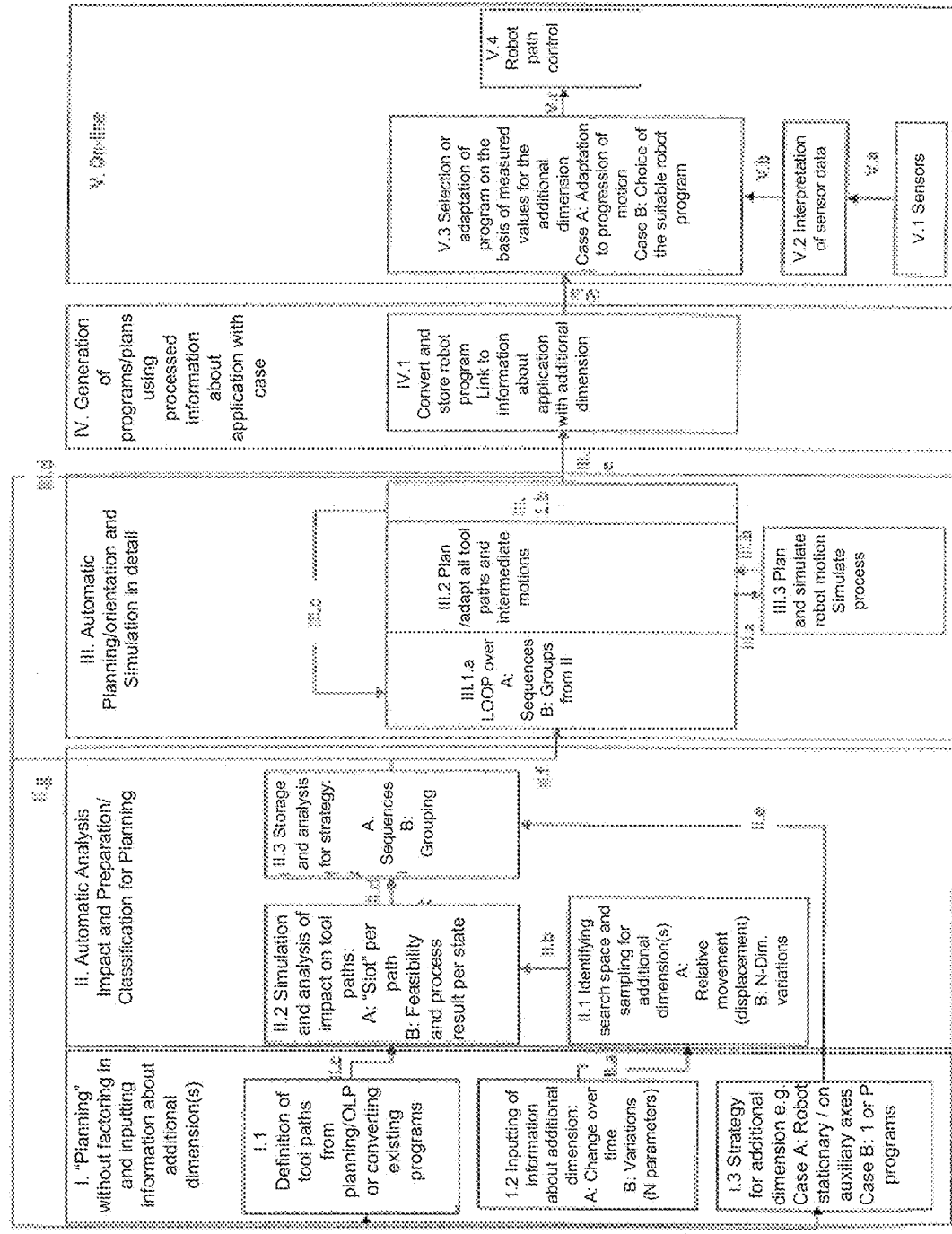
FIG. 4 a flow chart illustrating one example of the flow of the process according to the invention.

FIG. 4 shows, specifically:
I. Modules for planning/defining or for reading in a robot application without factoring in the additional complexity (I.1). In preparation for subsequent processing of the complexity/dimension that is additionally to be factored in, (metric) information about this is input or read in (I.2.) and the "strategy" (motion pattern for the robot base or multiple charts for multiple groups of states) for the handling thereof in later planning is input and/or read in (I.3.).
  I.1. A module for planning the paths of the tool in work piece coordinates and/or for reading in existing programs and converting these to tool paths in work piece coordinates.

I.2. An interface for reading in/inputting the information about the additional dimension, e.g., describing the movement of the work piece over time (hereinafter Case A) and/or the breadth and distribution of the individual variations/imperfections, e.g., position errors in directions of a system of coordinates (hereinafter Case B).

I.3. An interface for determining the strategy that will be used. In cases in which work piece movement will be factored in: choice of the robot base, stationary vs. mounted on auxiliary axes (including defining the length, dynamics and position thereof relative to the work piece conveyor).

II. Quick test and preselection: a module for the rapid ("random") simulation and analysis of the impact of the additional complexity/dimension to be factored in on the application. Response that the strategy and/or the "chart" that was established in I without factoring in the additional complexity cannot be implemented, or rapid (imprecise) planning to determine how these are to be processed in step III Planning. In Case A (an additional movement superposes the work piece), simulation/analysis are performed to determine those displacements between work piece and robot base at which the tool paths (according to the quick test) can be run (see FIG. 3). From these "time slots"/"corridors" and from the run times for the tool paths estimated based upon the target speed of the tool (see FIG. 1, reference sign 21), one or more favorable sequences and starting times for the paths are identified, which during detailed planning (step III) will be tested in detail and optimized. During this identification step, it can be determined at the same time if no sequence can be found or if, for the sequence that is found, the remaining time buffers (amount of time between time of execution of the tool path and time slot) are smaller than a minimum threshold, and therefore in the best case, charts can be identified during detailed planning (III) that are not robust in relation to already small imperfections relating to time (e.g. variations in the speed of the conveyor). In this case, the process will return to step I, in order to modify the initial tool paths (the initial chart) or the strategy. In Case B (parameter variations to be factored in), the chart from step I is simulated for various states (combinations of specific imperfections/parameter variations). All (discretized) imperfections for which the simulation of the originally (in I) planned chart provides a satisfactory result are combined (grouped) as a "case", and are stored together with this initial chart. All other states are grouped as cases when exclusively/predominantly) similar "problems" in robot motion (collisions or unfeasible) occur in the same segments of the tool paths and/or (similar) problems with process quality (stored and analyzed as a process result over the individual areas on the surface of the work piece or on shapes, features or substructure groups of the work piece) occur in the same location on the work piece. At the same time, all process problems that are identified in the simulation of the individual "states" are "overlaid" onto the work piece (in the case of process problems) and motion problems in the case of the paths (identified problems are given prevalence in order to obtain the worst case). If the percentage of identified problems (percentage of the length of the paths as a whole and percentage of the work piece to be machined (surface, volume)) drops below a bottom threshold, it can be assumed that it will be possible to factor in all of those (similar) imperfections (if necessary with small restrictions) using only a single chart, to be subsequently optimized, and therefore a single robot program, and the procedure in step III will reflect this accordingly. If the percentage is higher, but the proposed strategy is only one program, the process will return to step I. If the percentage exceeds a selectable upper threshold, the initial chart will likewise be discarded and the process will return to step I.

II.1 Identifying discrete states to be tested, which sparsely discretize the additional dimension in its defined "extent". Case A: automatic identification of the transformations between work piece and robot base to be tested, which reflects the movement of the work piece on the robot (with or without 7-axis). Case B: automatic identification of the states to be tested (e.g. $(2+1)^N$ or $(2)^N$ or $2*N+1$, see FIG. 2) which reflect the combined N individual imperfections.

II.2 Rapid simulation of the initial chart for executability with respect to the dimension/imperfection. Case A: determination of the executability of each individual tool path for each offset (from II.1). Determination of offset "windows" for which each path can be individually executed. Case B: Simulation (executability and process result) of all tool paths for one state each (imperfection case from II.1). In one embodiment example, for a variation that does not relate to the position of the work piece, or precision of the robot (but instead, e.g., to different degrees of efficacy of the tool), repeated planning/simulation of the robot motion can be dispensed with and the process can be simulated for a previously planned robot motion.

II.3. More detailed simulation and planning, Case A: determining the executability of each individual path for each offset (from II.1). Determination of offset "windows" for which each path can be run individually. Identification of sequences and starting times for the paths, so that each of these—executed at a target speed—lies, i.e. is executed, entirely within its own "window". Evaluating whether a return to step I is necessary. Case B: combining states from (II.1) that have a similar simulation result into groups for each of which a chart will be generated in step III. Evaluating whether a return to step I is necessary.

II.a. Information about the additional complexity/dimension. In Case A, about the motion profile (speed, fluctuations etc.) of the conveyor, in Case B about the individual imperfections/parameter variations and the range of fluctuations thereof to be factored in.

II.b. Processed information about how the additional complexity/dimension is to be tested, discretized (sampled).

II.c. Chart and/or tool paths in work piece coordinates, and optionally description of the area of the work piece for which machining will be carried out (or full machining).

II.d. Simulated result of the tool paths/the chart (II.c) for the states (II.b). In case A: path and "window" (number of sampled positions II.c) for which the respective path can be executed according to a simple test.

II.e. Selection of the strategy, Case A: e.g. without auxiliary axis, with auxiliary axis, optionally with information about the dimensions thereof (length, position dynamics). Case B: "one program for all possible parameter variations", "P programs for P groups of parameter variations".

II.g. If the evaluation shows that the initial chart (tool paths) is suitable for the selected strategy: transfer of initial tool paths (II.c) and (Case A) sequences, starting times, etc. or (Case B) grouping of the states according to the result.

II.f. Otherwise, return. Advantageously, including results of the simulation for visualization or new planning.

III: Automatic detailed planning, taking the additional dimension into consideration. In Case A, the states proposed in II (rough charts, sequences and starting times for the paths) are optimized and analyzed such that each individual path and the intermediate movements are planned over time using the dynamic robot model (with limited accelerations and speeds) and are simulated using the work cell that can change over time. The optimization in this case changes starting times and the speed of execution of a motion, and changes the executed paths slightly, with the goal of maximizing the distance of the robot-work piece offset that can still be achieved. In Case B, according to one embodiment example, it is distinguished whether the strategy is "one chart for all" or "P charts for all". For the strategy of "one chart for all", only the initial chart is iteratively optimized using known methods, wherein as a criterion, the following are minimized: the percentage of the work piece to be machined (generally as a percentage of the surface to be machined) for which the simulated result (then stored on the surface) is not within the permissible tolerance limits (or weighted, e.g. according to the degree of deviation), execution time, etc. In the case of "one chart for all", the currently optimized version of the chart is always simulated the same for all or for multiple different (random and increasing in number) states (of the imperfections), and "overlays" the result, advantageously overlaying it such that the imperfections overwrite the satisfactory executions. For the strategy of "P charts for all", the groups identified in II are processed in sequence, and a separate chart is optimized for each group. This can either be carried out for all tested states in a group in the same manner as for the strategy of "one chart for all", or it can first be simulated for each tested state of the current group to determine whether a previously optimized chart (chart from the same group or optimized for a different group) will supply a satisfactory simulation result. If so, it will be assigned to the group (without modifying the chart), and if not, for the one state currently being tested, the chart will be iteratively optimized (i.e., a new chart will be prepared) such that the costs (simulated problems, time, etc.) are minimized for only that state. State and chart form a new group. In one advantageous embodiment, all newly (rather than originally) assigned states and states for which a new group has been "opened up" are earmarked for exceptional handling, in which it will be tested upon completion whether these states can be further combined. It is advantageous that the tested states within one group are chosen on the basis of the simulation results for tested states in the group, in order to allow testing to be performed more accurately (more closely) at/near the edges of ranges (group boundaries) and at critical locations than at non-critical locations. In Case A and Case B, the chart or the charts is/are stored with the additional information (A: time, B: covered range of parameter variations). In both cases, a final analysis is advantageous—optionally a return to I.

III.1. Loop over all initial sequences (Case A) or (Case B) cases/groups.

III.2. Planning/optimization varies the paths in terms of time, speed, the precise process thereof to minimizing the problems simulated (in III.3) (e.g. as a percentage of the surface) and/or to minimizing the time required for execution.

III.3. Simulation of the robot motion over time and of the resulting process outcome (used in III.2).

III.a. Varied process path;

III.b. Simulation result: precisely (using a robot model) simulated robot motion (including deviations from the ideal target path) and the process result simulated for this (for a work piece description: e.g. CAD model of the work piece surface), optionally abort message when a part of the path cannot be executed or when computing time or iteration exceeds an associated threshold;

III.c. Return until all groups or sequences have been processed, or until a satisfactory result is achieved;

III.d. Return to step I if no solution is found (for a percentage or for a sufficiently large percentage of cases);

III.e. If charts are found: forwarded, including associated information about the additional dimension. (In Case A: indication of time or position of the conveyor for the individual support points of the motion/chart, in Case B: range of the imperfection for which the charts are to be applied).

IV. Generation of programs using additional information about the additional dimension.

Case A: conversion of the planned robot motion (in axis coordinates and time) to a robot program comprising support points (or splines, etc.) by sampling the planned movements (with indications of the speeds and time/component position/encoder value of the conveyor at which this position is to be reached). The program can be output in two parts:

i) as a list of positions and speeds which is more closely set/sampled than is necessary for a robot controller; and ii) a processing program in the form of a loop, which reads the current actual value (position and speed) of the conveyor, and on the basis of this value, chooses or interpolates the next target position of the robot from i) or and adjusts the speed on the basis of the current speed of the conveyor and the progression of the motion of the robot in relation to the conveyor movement (rushing ahead, lagging behind) using a simple, known control principle (P, PID, . . . ) (line tracking). With this advantageous implementation, errors in the planning of the robot motion (in particular, errors in the model of the robot dynamics and control) are compensated for, and the robot speed is automatically adapted to the conveyor speed, up to the point of a complete stop or even reverse motion.

Case B: For each group: conversion of the planned robot motion to a robot program comprising support points (or splines, etc.) by sampling the planned motions. Stored together with the additional information about the application range (=measurable parameter variation of the respective group).

IV.1. Module for converting charts into executable robot programs with additional information, and storing.

IV.a. Executable robot programs with additional information for use in reference to additional complexity/dimension.

V: Online processing:

Case A: Sensor detection of the dimension of conveyor movement (position and speed) and processing of the program according to the progression of movement of the conveyor. Advantageous case as described in IV. Case B: sensor detection of the actual value of the imperfection(s) and selection of the corresponding group. Processing the program assigned to this group. Optional interpolation or optimization using the precisely measured imperfection.

V.1. Sensor(s)

V.2. Interpretation of the sensor data as a value with respect to the automatically factored in dimension.

V.3. Selection or processing of the program according to interpreted sensor data.

II.a. Information about additional dimension/complexity to be factored in.

II.c. Tool paths in work piece coordinates (incl. work piece information, e.g. CAD)

II.e. Information about strategy for factoring in the additional dimension/complexity.

Figure 5:
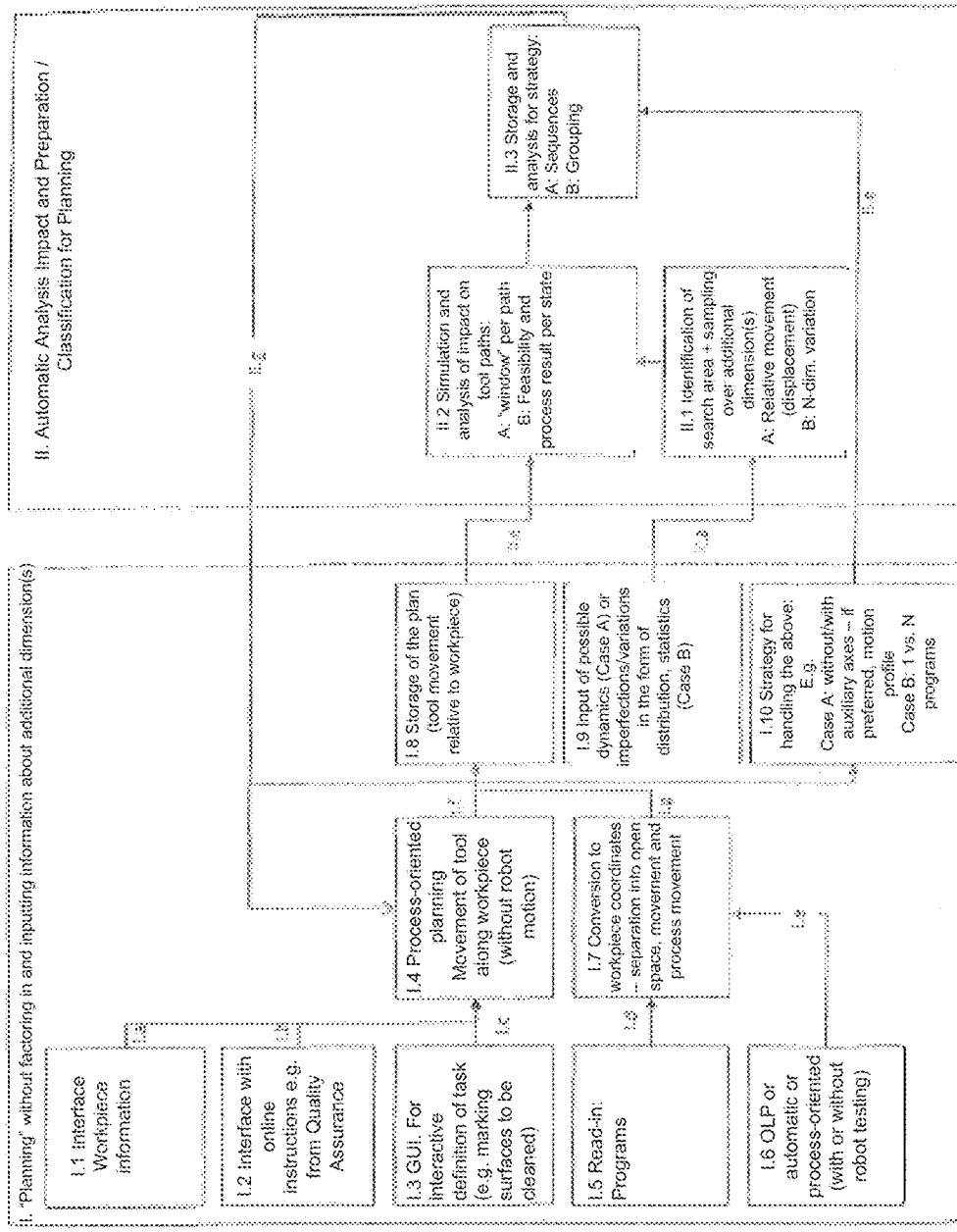
FIG. 5 details of step II of the process flow of FIG. 4.

FIG. 5 shows particularly a more detailed description of the input/planning before the additional complexity/dimension is factored in (Overview: FIG. 4).

Figure 6:
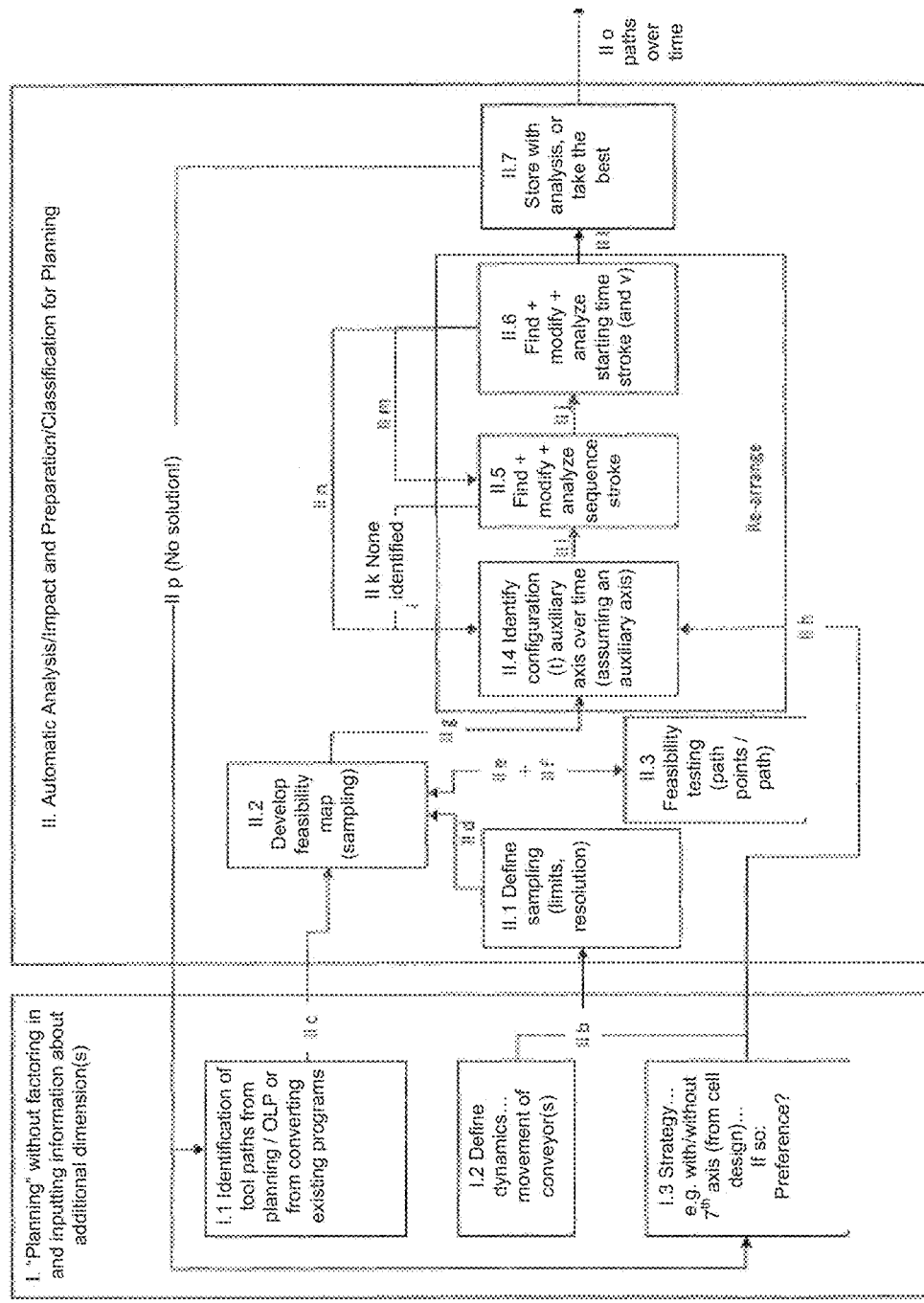
FIG. 6 details of the process flow of FIG. 5 for a first alternative (factoring in the movement of a work piece)

I. Planning/definition or factoring in of additional dimension/complexity;
I.1. Input of information about the work piece (e.g. CAD data and the relevant surface);
I.2. Definition of the application e.g. from previous process steps (e.g. Q.S);
I.3. GUI for interactive definition of the application;
I.4. Module for process-oriented planning of tool movements;
I.5. Interface for reading in existing programs and charts;
I.6. OLP module;
I.7. Module for converting conventional programs into tool paths in work piece coordinates;
I.8. Storing the tool paths;
I.9. Interface for inputting the information about the change in the cell over time. In the case of "line tracking" (Case A), this is the measured movement speed of a conveyor, and therefore of the work piece, and the earliest starting time/latest ending time of the program or of the possible variations
(Case B) (in the case of process protection, this is information about individual imperfections and optionally the dependencies or exclusion thereof);
I.10. Interface for selecting the strategy for handling the additional dimension;
II. Automatic analysis and pre-processing (this is described in FIG. 5 and in detail in FIG. 6 (Case A) and FIG. 7 (Case B));
I.a. Information about the work piece (generally CAD and additional information e.g. marking of the surface of the work piece to be machined)
I.b. Information generated online about the application: e.g. instruction list (tool+work piece-oriented) from sensors and/or QA. (Identified defects/marking points/marking paths . . . )
I.c. Interactively defined tool paths (in work piece coordinates)
I.d. Robot programs (existing, read-in)
I.e. Robot programs (generated in OLP)
I.f. Tool paths in work piece coordinates (incl. work piece information, e.g. CAD)
I.g. Tool paths in work piece coordinates (incl. work piece information, e.g. CAD)
II.a. Information about additional dimension/complexity to be factored in
II.c. Tool paths in work piece coordinates (incl. work piece information, e.g. CAD)
II.e. Information about strategy for factoring in the additional dimension/complexity FIG. 6 shows in detail:
I. Planning/definition without factoring in the additional dimension/complexity, is described in FIG. 4 and in detail in FIG. 5;
II. Automatic analysis of the impact of the additional dimension and preprocessing;
II.1. Determination/definition of the search area and the sampling (=states to be tested);
II.2. Development of a "feasibility map" i.e. offset of the work pieces for which path points/tool paths are feasible or executable without collision;
II.3. Simulation of the feasibility/executability of the path points (the tool paths);
II.4. In the case of auxiliary axes: identification of advantageous configurations of these axes over time, e.g., by maximizing the breadth of available buffers;
II.5. Optimization of the sequence: changing the sequence of the tool paths (always all path points on a tool path) and analysis. Criterion (see FIG. 3): The line that represents the movement of the conveyor intersects all of the vertical lines (or as many as possible) that represent the permissible displacements per path point. The distance between the points of intersection and (both or the last) the extreme values of the vertical lines is analyzed (maximized). The time for movement between tool paths can come from a standard setting, an estimate or a determination (as in II.6);
II.6. Optimization of the starting time of the tool paths (and optionally of the path speed thereof). Maximized is either the distance to the latest possible time (i.e., a buffer is established which will tolerate delays in robot motion) or the distance to the earliest and latest possible times (i.e., the buffer is symmetrical);
II.7. Storing and analyzing the solution(s);
II.a. Information about the movement/adjustment of the cell over time;
II.b. Strategy for factoring in this additional dimension/complexity;
II.c. Tool paths (in work piece coordinates), information about work piece and cell,
II.d. (Number of) states to be tested (variations)
II.e. Path points on the tool paths (optional segments or entire tool paths)—and state currently being tested,
II.f. Evaluation of the feasibility/executability of the path point for the current state,
II.g. Feasibility map,
II.h. Strategy for factoring in this additional dimension/complexity,
II.i. Tool paths, feasibility map and configuration of the auxiliary axes (over time),
II.j. Identified, optimized sequences of tool paths,
II.k. Return, if no sequence is identified,
II.l. Identified, optimized starting times and motion speeds of the tool paths,
II.m. Return, if no starting times for sequences are identified,
II.n. Return, if feasible starting times are not found for any sequence (but result is concise),
II.o. Tool paths with starting times and speed (path points as points in time). Additionally, permitted delays (max_delay) (in time or in relation to the work piece-conveyor offset),
II.p. Return if no adequately evaluated solution (sequence/starting times).

Figure 7:
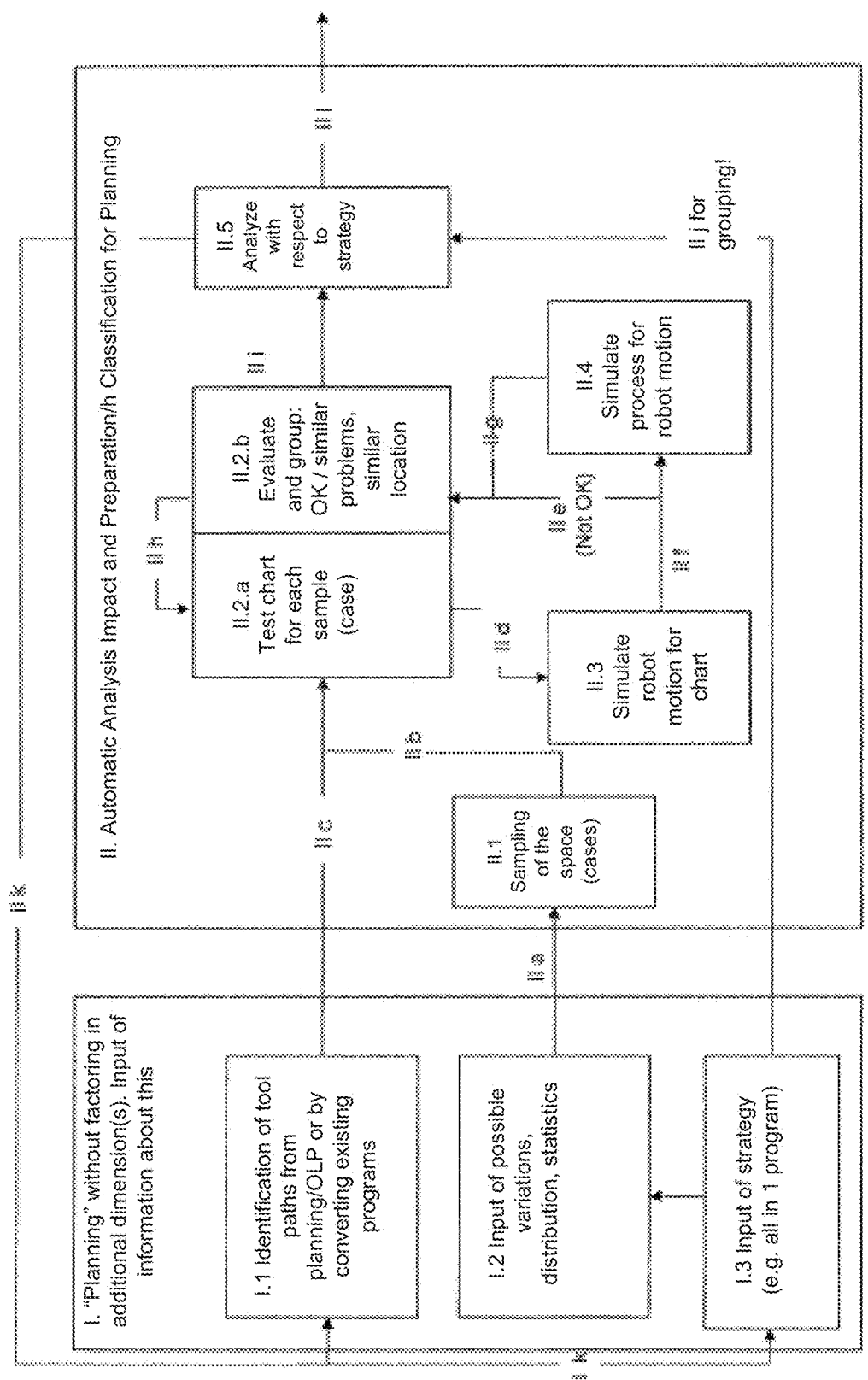
FIG. 7 details of the process flow of FIG. 5 for a second alternative (factoring in parameter variations)

FIG. 7 shows in detail the automatic analysis of the states and preparation/categorization into groups for planning in step III.

I. Planning/definition without factoring in the additional dimension/complexity is described in FIG. 4 and in detail in FIG. 5;
II. Automatic analysis and pre-processing (Case B)
II.1. Definition of sampling. Definition of states for covering the breadth (specified in II.a) of the additional dimension and reduction for factoring in correlations/dependencies (specified in II.a),
II.2.a. (Loop for) processing each state from IIb. Retrieval of simulation/planning for each state,
II.2.b. Analysis of the result of simulation for the state currently being tested. Grouping the states on the basis of similar results ("same problems at the same location, motion segment"), II.3. Plan/simulate the robot motion for the state currently being tested and the tool paths (of the chart),
II.4. Simulate the process for robot motion,
II.5. Evaluate the result II.i. for the selected strategy. In particular, compare the number of groups to determine whether one or more charts (later programs) are permitted.
II.5 and II.2.b can be consolidated to allow the grinding machining to be processed early.)
II.a. Information about the additional dimension. Number of individual variations and the breadth of their respective variation (e.g. min/max). Possible correlations, exclusion, etc.
II.b. List of the states to be tested for sampling/analysis of the space of the new dimension(s),
II.c. Tool paths (and information about the work piece, e.g. CAD and areas to be machined),
II.d. Tool path and state,
II.e. If no satisfactory robot motion is identified (which can be X % successfully executed): abort,
II.f. Planned and simulated robot motion and current state,
II.g. Simulation result of the robot motion from II.3=II.f,
II.h. . . . until all states have been processed
II.i. all states and results,
II.j. Strategy,
II.k. Abort, if not sufficient,
II.l. Forwarding of grouped states (and initial tool paths).
II.2, II.3, II.4, II.5 access the information relating to the work piece, even though the information flows are not explicitly shown here.

Figure 8:
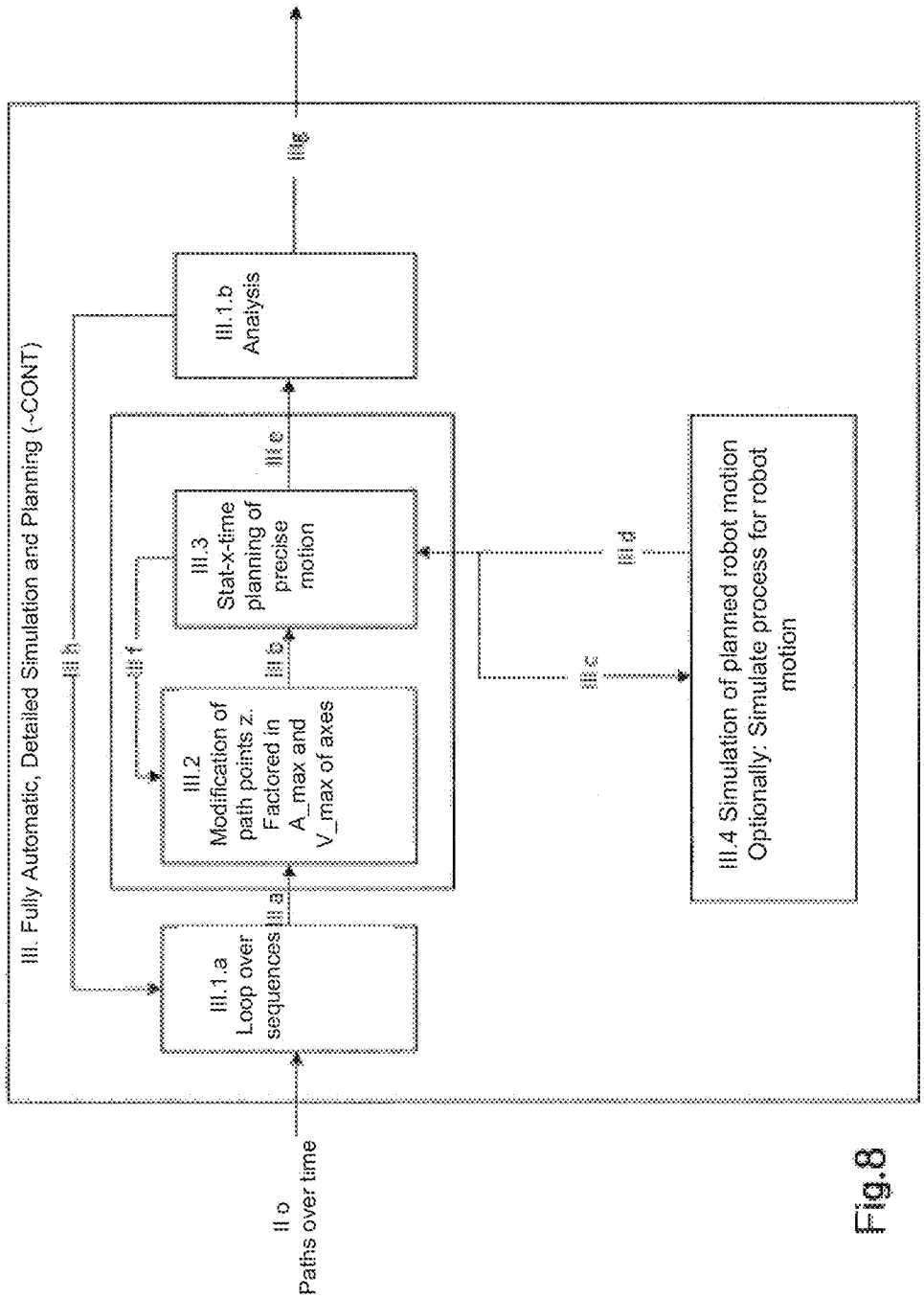
FIG. 8 details of step III of the process flow of FIG. 4.

FIG. 8 relates to step III for the case of the work piece movement to be factored in, the automatic detailed planning/optimization/validation step, and shows in particular:
III.1.a. (and III.1.b) Loop and analysis of all identified sequences, abort after all, or optionally after the first satisfactory sequence (above the threshold),
III.2. Adaptation of the tool paths to limited acceleration and speed of the individual axes by modifying the path points,
III.3. State-x-time planning for the modified paths,
III.4. Simulation of the robot motion and of the process result for the planned robot paths (in a changing environment),
III.a. Tool movements incl. sequence and timing,
III.b. Modified robot movements (in the state space),
III.c. Planned robot movements for tool paths and intermediate movement,
III.d. Simulated planned robot movement,
III.e. Simulated robot movement or no solution (e.g. in the case of timeout, etc.),
III.f. Return to III.2 as long as planned robot motion no solution (with the problem/reason why no solution),
III.g. (Chart in the degree of detail of a) robot motion evaluated as best in the state space, including information about the state (change in the cell that occurs at the same time as the planned robot motion)/information about time/conveyor,
III.h. Return as long as additional sequences and no timeout.

Figure 9:
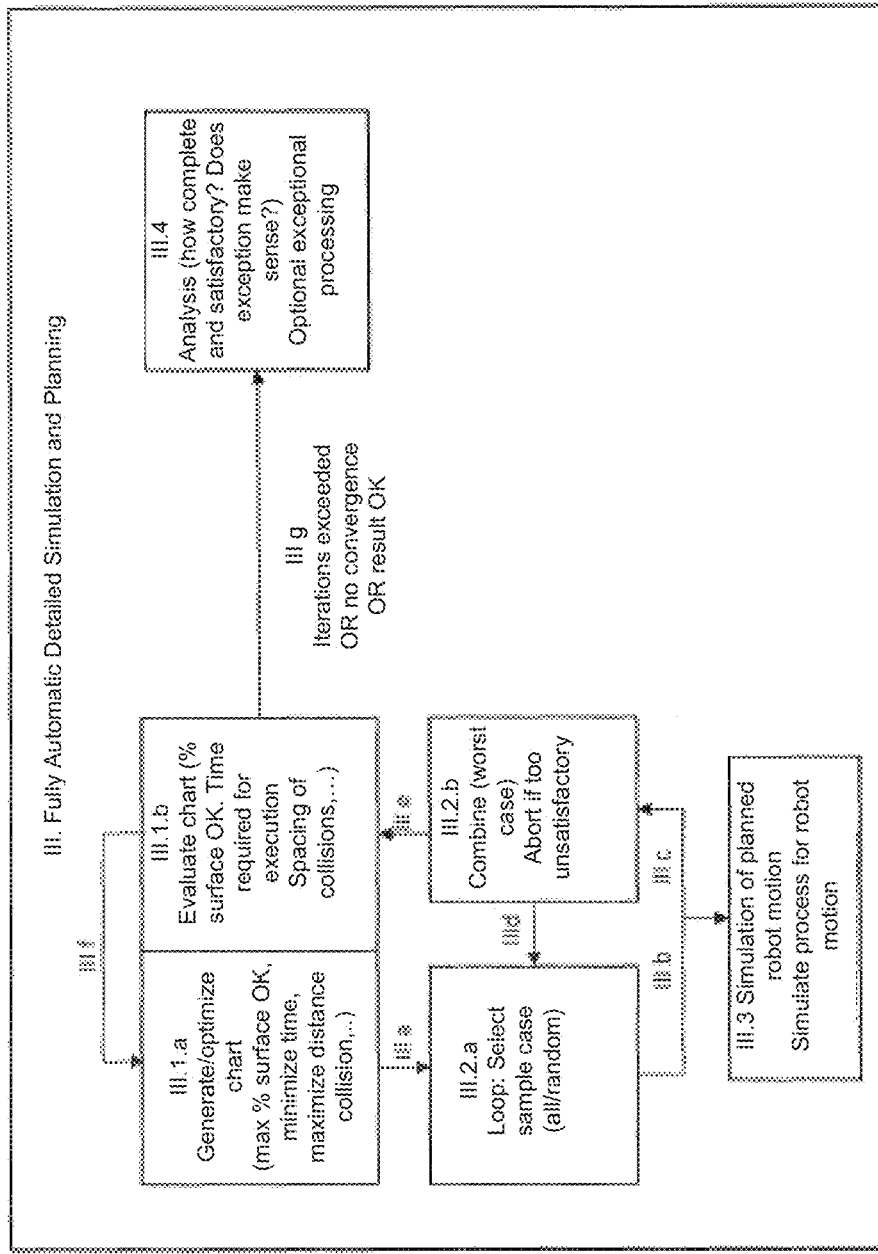
FIG. 9 details of the process flow of FIG. 8 for a first alternative (one chart for all states)

FIG. 9 relates to step III for the case of the parameter variations to be factored in, the automatic detailed planning/optimization/validation step, and shows for the strategy of "one plan for all", in particular:
III.1.a and III.1.b: Optimization of the tool paths by variation (a) and evaluation (b) according to criteria: Maximizing the percentage of the surface that has a usable process result (or minimization of unusable), minimization of the execution time or maximization of the distance between collisions, etc. Planning of a precise robot motion for the tool path. (Details in FIG. 13, on the left)
III.2.a: Loop over various (some randomly selected up to all) states. For example, in the first iterations, only part of all states (selected using a random generator and increasingly complete with each iteration) is tested. The proportion (as a percentage) is defined in III.1.a.
III.2.b. Summary of the result, advantageous in a worst-case overlay of the results on the work piece.
III.3. Simulation of the robot motion and the process result for the planned robot paths from III1. per state from II. (Details in FIG. 13, on the right).
III.a. Robot motion,
III.b. Robot motion and selected state to be simulated,
III.c. Result of simulation,
III.d. Return, as long as not all states have been processed
III.e. Summarized result over all simulated states (e.g. worst case),
III.f. Return for optimization (as long as no timeout, satisfactory result, convergence, . . . ).

Figure 10:
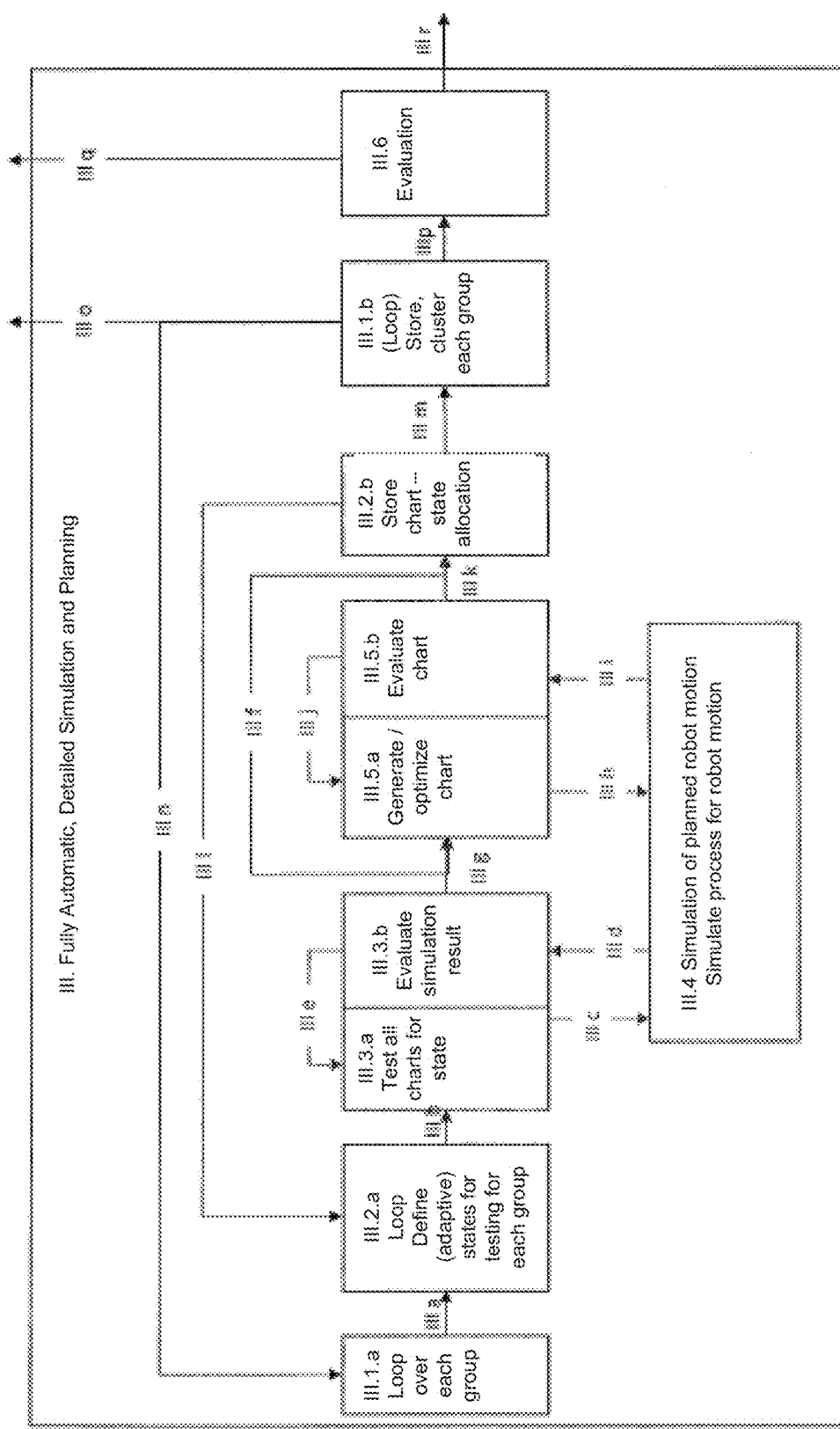
FIG. 10 details of the process flow of FIG. 8 for a first alternative (P charts for all states)

FIG. 10 relates to step III for cases in which parameter variations are to be factored in, the automatic detailed planning/optimization/validation step, and shows for the strategy of "one plan for all", in particular:
III.1.a Loop over all groups initially identified in II;
III.1.b Loop end, storage of the groups and evaluation: return, as long as not all groups have been processed, otherwise continued. As long as established groups greater permissible number N of programs (strategy defined in I), exit, back to I);
III.2.a Determination of the states to be tested within the group, and processing as a loop. In one advantageous implementation, the sampling is variable: 1) on the basis of the results from previous states (closer where problems, where transitions), 2) closer at boundaries of the group in the state space;
III.2.b Loop end. Storage of the tested state for an existing group, or formation of a new group. Return if not satisfactorily closely sampled, or continue. If the number of groups that have already been formed is greater than the permitted number N of programs: exit and return to I). Evaluation to determine whether group sufficiently complete here (or in IIa);
III.3.a Loop: Call up all charts previously established per group for the state to be tested and, and initiate simulation thereof. Start with the current group (no change in the charts here);
III.3.b Loop end. Intermediate storage and evaluation of the simulation result for the tested charts (executable, duration, process result, optionally stability/spacing of collisions). E.g.: Abort if simulation result for the chart that belongs to the group is satisfactory, otherwise test for all charts and choose the best;
III.4 Simulation of robot motion and the process (details in FIG. 13, on the right);
III.5.a (and III.5.b) Optimization of the tool paths by varying (a) and evaluating (b) according to criteria: Maximizing the percentage of the surface that supplies a usable process result, minimizing the time required for execution or maximizing the spacing of collisions, etc. Planning a precise robot motion for the tool path. (Details in FIG. 13, on the left). End as soon as the threshold has been exceeded, timeout, max. number of iterations, convergence slower, etc.
III.6. Final evaluation (how complete, how satisfactory). Comparison with strategy, optionally return to I.

III.a. Group currently being tested and chart currently being tested (in the degree of detail of tool paths)
III.b. State currently being tested and chart currently being tested (in the degree of detail of tool paths)
III.c. State currently being tested and chart currently being tested (in the degree of detail of tool paths) either initial or other identified plans . . . .
III.d. Evaluation
III.e. Return if chart is not evaluated as satisfactory (or variant—if the initial chart is not suitable, until all charts have been tested)
III.f. State and suitable group identified: Skip further optimization if suitable chart is identified
III.g. State (if no previous chart is suitable)
III.h. Optimized robot motion (modified only the first time!)
III.i. Result of motion simulation and process simulation
III.j. Return for optimization (assuming no timeout, satisfactory result, convergence, . . . )
III.k. State and suitable group (with chart) or no chart can be generated for this state.
III.l Return until sufficiently closely tested (here, also abort as in III.o, III.q.)
III.m. State+group+chart
III.n Return to loop start until all groups have been processed.
III.o Abort
III.p Group and chart
III.q Abort
III.r All formed groups incl. chart per group According to one embodiment example, for a group for which a chart has already been optimized in III.5, those states for which in III.3 this chart does not supply a satisfactory result can be intermediately stored, and only after all (other) states have been tested (and charts optionally modified), these can be retested in III with the charts for all groups, and the generation of new charts and groups optionally initiated. In this manner, these states are tested against more already optimized charts, and an allocation is more probable, as a result of which the number of groups can be kept lower.

Figure 11:
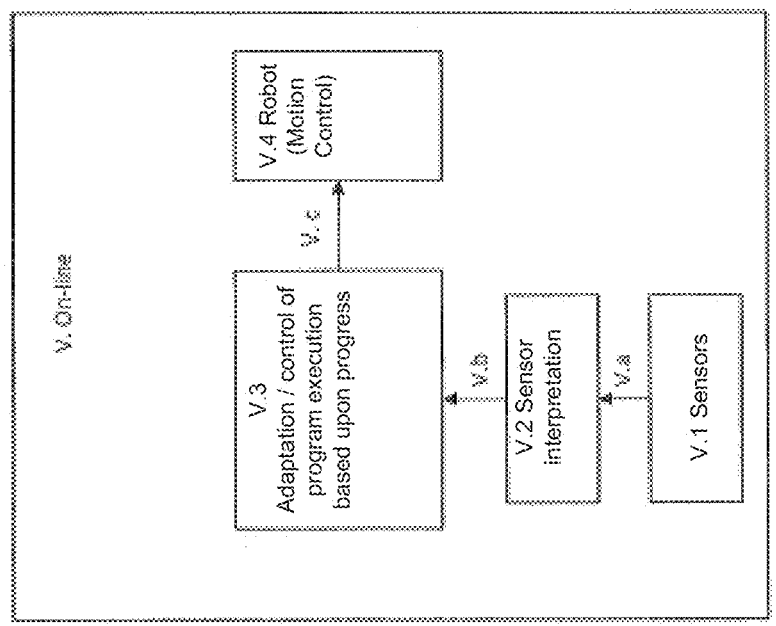
FIG. 11 a flow chart illustrating the flow of the process for step V of the method of FIG. 4 (the ON-line execution of a program that factors in the additional dimension "work piece movement")

FIG. 11 shows details of the process sequence of FIG. 4 for step V (online execution of a program, taking the movement of the work piece into consideration). In particular, FIG. 11 shows:
V.1 A sensor for detecting the information about the additional dimension of movement, e.g. encoder for conveyors;
V.2 Interpretation of sensor data, e.g. extraction of the state and speed of the conveyor;
V.3 Adaptation/control of program execution to the program progression and to the extracted information about the movement of the conveyor. Variable selection of the next support points from the program with overly closely sampled support points (on the basis of conveyor position and speed support point) or also, interpolation and speed for the next movement (v variable), and/or choose next position;
V.4 Robot controller and/or robot motion control;
V.a. Sensor information about additional dimension, e.g. encoder values,
V.b Interpreted information, e.g. position and motion speed of the work piece,
V.c. Adapted program/path points (Point-to-Point, PTP).

Figure 12:
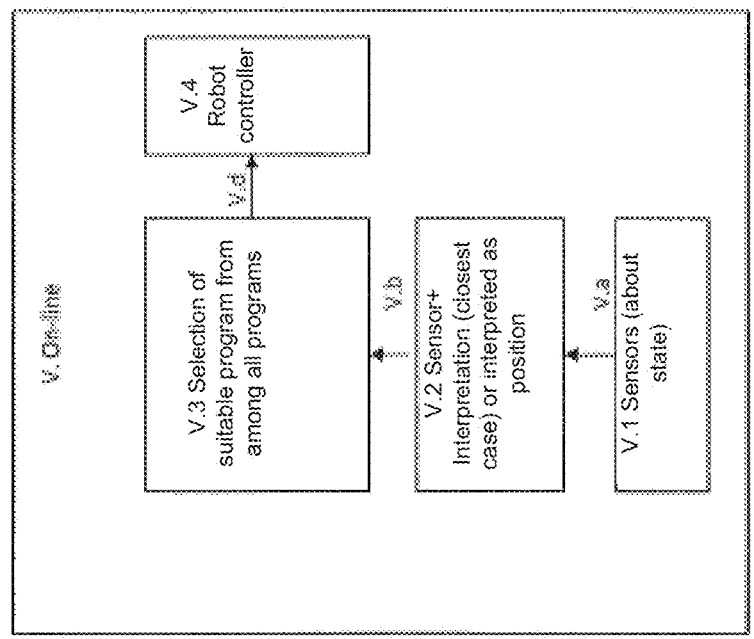
FIG. 12 a flow chart illustrating the flow of the process for step V of the method of FIG. 4 (the ON-line execution of a program that factors in the additional dimension of "parameter variations")

FIG. 12 shows details of the process sequence of FIG. 4 for step V (online execution of a program, factoring in the parameter variations). In particular, FIG. 12 shows:

V.1 A sensor for detecting the information about the additional dimension. E.g. camera for position detection or flow measurement/pressure measurement,
V.2 Interpretation of sensor data, e.g. position deviation of the work piece or applied layer thickness/seconds,
V.3 Selection of the suitable robot program (measured position deviation is within the value range/state space for the group). Entering into robot controller;
V.4 Robot controller and/or robot motion control.
V.a Sensor information about additional dimension, e.g. camera image, point cloud,
V.b Interpreted information, e.g. detected position (or position deviation) of the work piece,
V.c Selected robot program (PTP).

Figure 13:
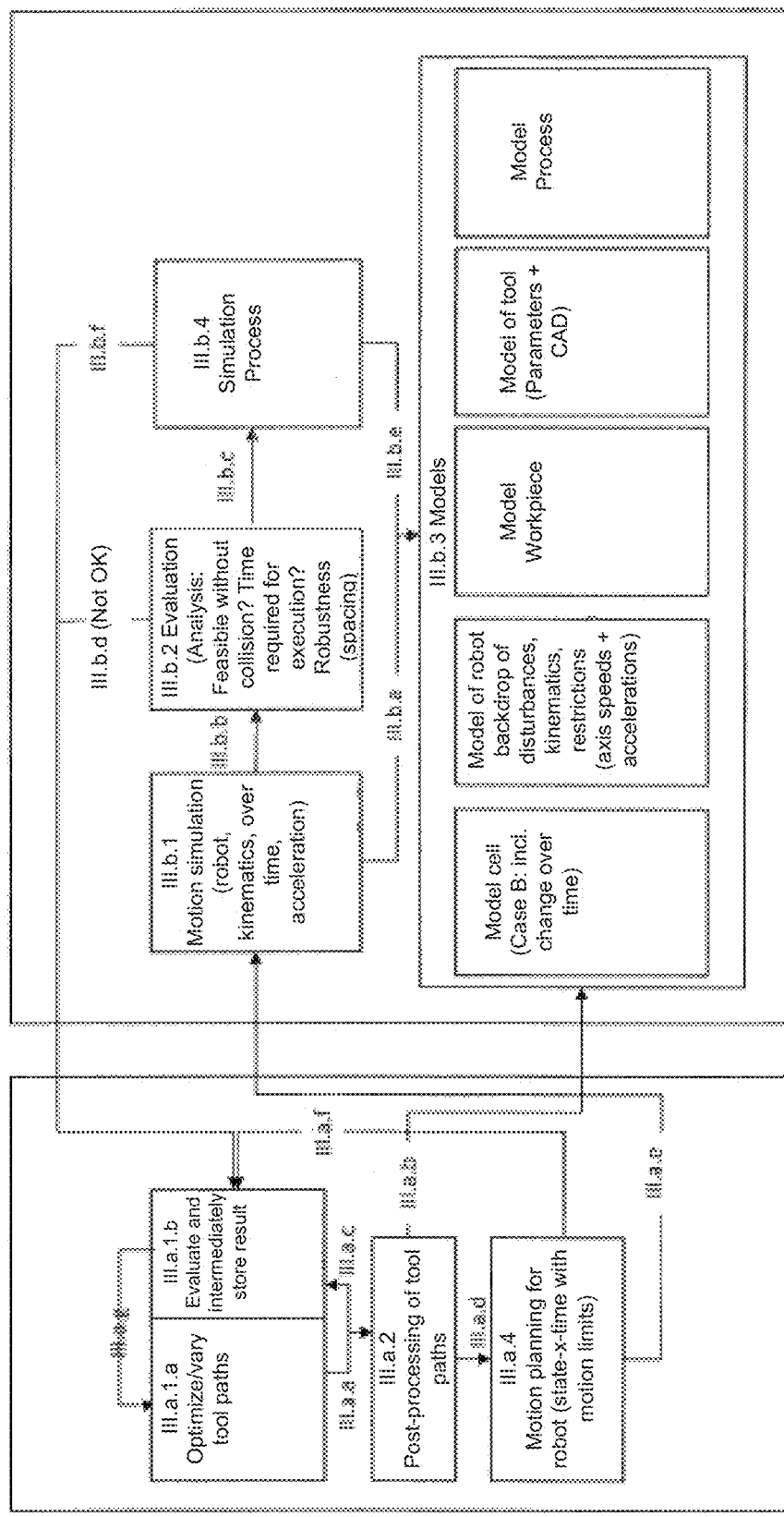
FIG. 13 details of the process flow for step III of FIGS. 8 to 10 Left: movement planning (left) and right: simulation. In the figures, the same reference signs are used to identify the same or similar components having the same or similar significance.

FIG. 13 shows details of the process sequence of optimization step III as shown in FIGS. 8 to 10. FIG. 13 shows, in particular:
III.1.a Tool path (=tool path); optimizer: varies path points on the paths (involves movement of the tool to the work piece) with known methods according to the evaluation from III.1.b.
III.a.1.b. Evaluation criterion: minimizing the percentage of the surface of the work piece for which the simulation reports an unusable result. Optionally, minimizes the percentage of segments of the tool paths that, according to planning and simulation, cannot be executed using the robot. Intermediate storage of the result (chart with percentage for which process and robot motion are in order, time required for execution).
III.a.2. Follow-up processing of tool path: collision prevention for tool and smoothing. Monitoring of parameter limits? Variation is smaller than the threshold value (otherwise, it would be new and III.a.1 overwritten/ineffective).
III.a.3 Motion planning for the robot in state-x-time, including factoring in acceleration and speed limitations of the axes as in error! Reference source could not be found. Described.
III.b.1 Motion simulation (dynamic model),
III.b.2 Analysis for feasibility (collision-free) time required for execution,
III.b.3 Models, including model of the cell, robot, work piece, tool, process,
III.b.4 Process simulation;
III.a.a Tool paths varied;
III.a.b Access to model of tool and work piece
III.a.c Return if no collision-free tool motion is identified for which change is smaller than the threshold value;
III.a.d Smoothed tool paths without tool collisions;
III.a.e Planned robot motions for tool paths and intermediate movement;
III.a.f No robot motion identified;
III.b.a Access to models;
III.b.b Simulated planned robot motion;
III.b.c Tested robot motion
III.b.d. Return if robot motion is not OK.
III.b.e Access to models (process, tool, work piece).
III.b.f. Robot motion and analysis (simulation result of process)

The invention claimed is:

1. A method for the automatic, computer-assisted generation of workflow charts for processing a work piece with a tool using an industrial robot, the method comprising:
preparing an initial chart with a plurality of tool paths for a work piece in a specific target position and for specific process parameters that impact the processing of the work piece, a tool path defining a target movement of the tool along the work piece;

defining a state space describing variable parameter values that impact the processing of the work piece, wherein each point in the space represents a specific combination of potential parameter values, wherein the variable parameter values relate to properties of the workpiece or to the processing of the work piece;

discretizing, with the computer, the space into individual states;

simulating, with the computer, the processing of the work piece using the initial chart for one or more discrete states and analyzing a result of the simulated processing based on a pre-definable criterion;

with the computer, iteratively modifying the initial chart and subsequently simulating the processing of the work piece using the modified chart for at least one discrete state, and evaluating the result of the simulated processing based on a pre-definable cost function, wherein the modifying, subsequently simulating, and processing steps are all performed in the iteration; and performing, with the computer, the iteratively modifying step until the cost function reaches a minimum or drops below a threshold value, indicating that an optimized chart for the respective state has been identified.

2. The method according to claim 1, which further comprises:

allocating, with the computer, the optimized chart and the state used in the iteration to a first group;

simulating, with the computer, the processing of the work piece using the optimized chart for a further discrete state and evaluating a result of the simulated processing of the work piece based on the pre-definable cost function; and allocating, with the computer, the additional state used in the simulation to the first group when the cost function for the additional state drops below a further threshold value; or allocating, with the computer, the additional state used in the simulation to a further group when the cost function for the additional state does not drop below the further threshold value.

3. The method according to claim 2, which further comprises:

with the computer, iteratively modifying the optimized chart, subsequently simulating the processing of the work piece using the modified chart for the additional state, and evaluating the result of the simulated processing of the work piece based on the cost function;

with the computer, further iteratively modifying the chart until the cost function reaches a minimum or drops below a threshold value, indicating that a further optimized plan for the additional state has been identified; and with the computer, allocating the optimized chart and the state used in the iteration to a first group.

4. The method according to claim 1, which comprises, prior to an iterative modification of a chart for a specific state, testing through simulation, on the computer, to determine whether a previously optimized chart for the specific state will result in a processing result for which the cost function falls below a predefined threshold value.

5. The method according to claim 1, which comprises, prior to performing the step of iteratively modifying the initial chart, discarding all states for which the result of the processing simulated with the initial chart fails to satisfy a pre-definable criterion.

6. The method according to claim 1, wherein the step of modifying a chart comprises modifying the chart by performing at least one of the following steps with the computer:

changing an execution sequence of the tool paths of a chart;

changing a speed of execution of a tool path or of a segment of a tool path;

shifting a position of a tool path or of individual segments of a tool path;

changing a position and an orientation of the tool relative to the work piece along individual tool paths or path segments;

changing a robot configuration for individual tool paths or path segments;

changing a force that is exerted by the tool on the work piece or another parameter that relates to an interaction between the work piece and the tool.

7. A method for the automatic, computer-assisted generation of workflow charts for processing a work piece with a tool of an industrial robot, the method comprising:

providing an initial chart containing a plurality of tool paths for a work piece in a specific target position and for specific process parameters that describe the processing, wherein a tool path defines a target movement of the tool along the work piece;

defining a state space, which describes possible sequences and starting times for the tool paths of the initial chart, wherein each point in the state space describes a specific sequence having a specific starting time;

discretizing, with a computer, the space into individual states;

simulating, with the computer, the processing of the work piece using the initial chart for different, discrete states, and analyzing a result of the simulated processing according to a pre-definable criterion;

with the computer, iteratively modifying the initial chart, then simulating, factoring in a movement that superposes the work piece, the processing of the work piece using the modified chart for at least one discrete state and evaluating the result of the simulated processing according to a pre-definable cost function; and performing, with the computer, the iteration until the cost function reaches a minimum or drops below a threshold value, indicating that an optimized chart for the respective state has been identified.

8. The method according to claim 7, which comprises, prior to performing the step of iteratively modifying the initial chart, discarding all states for which the result of the processing simulated with the initial chart fails to satisfy a pre-definable criterion.

9. The method according to claim 7, which further comprises specifying a motion pattern for a robot base of the industrial robot and factoring in the motion pattern in the simulation.

10. The method according to claim 7, wherein the simulating step comprises calculating a time slot and/or a window with respect to the displacement between robot base and work piece, for which a path point of a tool path can be achieved by the tool.

11. The method according to claim 10, wherein the cost function increases as the tool becomes closer to an edge of the time slot in the simulated execution of a tool path.

12. The method according to claim 7, which further comprises, for each optimized plan, assigning a target relative position between work piece and robot base to each path point on a tool path.

13. A method of controlling a robot for processing a moving work piece by way of a tool using an industrial robot according to a chart containing a plurality of robot motions defined by path points, wherein each path point is assigned a target position of the work piece, the method comprising a step of obtaining the chart containing the plurality of robot motions by performing the method according to claim 1, the method also comprising the following steps, to be performed during an execution of a robot motion:
- measuring, with at least one sensor, an actual position of the work piece and determining, with a computer, a speed of the work piece;
- calculating, with the computer, a current target position of the work piece for the current position of the robot using the target positions of the work piece that are assigned to the path points;
- calculating, with the computer, a difference between the target position and the actual position of the work piece;
- determining, with the computer, a next target position of the robot to be reached, and a time at which the next target position is to be reached, so as to decrease or minimize a difference between the target position and the actual position of the work piece.

14. The method according to claim 13, wherein the step of calculating the current target position is effected by interpolation.

15. The method according to claim 13, wherein the step of determining the next target position of the robot to be reached comprises selecting a path point according to the chart or interpolating between two path points according to the chart.

* * * * *